(12) United States Patent
Tada

(10) Patent No.: US 6,412,095 B1
(45) Date of Patent: *Jun. 25, 2002

(54) METHOD AND APPARATUS FOR COMPACTING WIRING LAYOUT

(75) Inventor: Hiroyuki Tada, Kasugai (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/047,491

(22) Filed: Mar. 25, 1998

(30) Foreign Application Priority Data

Sep. 24, 1997 (JP) .............................. 9-259065

(51) Int. Cl.⁷ .............................................. G06F 17/50
(52) U.S. Cl. ............................................ 716/2; 716/12
(58) Field of Search ...................... 395/500.03; 716/2, 716/12

(56) References Cited

U.S. PATENT DOCUMENTS 5,046,012 A * 9/1991 Morishita et al ............ 364/468
5,663,892 A * 9/1997 Hayashi et al. .............. 364/491
5,729,469 A * 3/1998 Kawakami ................... 364/490
5,889,677 A * 3/1999 Yasuda et al. ................ 716/6
5,889,681 A * 3/1999 Suda ........................... 364/491
6,240,541 B1 * 5/2001 Yasuda et al. ................ 716/6

FOREIGN PATENT DOCUMENTS

JP         409069115 A  *  3/1997

* cited by examiner

Primary Examiner—Matthew Smith
Assistant Examiner—A. M. Thompson
(74) Attorney, Agent, or Firm—Armstrong, Westerman & Hattori, LLP

(57) ABSTRACT

Compacting a wiring layout of semiconductor integrated circuit having at least two metal layers in which two first layer wires of the same wiring are originally arranged at different locations and connected together by a second layer wire. First layer wires of other wiring are identified that interfere with a line extending from one of the two first layer wires and forms an enlarged area between the obstructed first layer wired and the interfering first layer wire. Next, the other one of the two first layer wires is shifted to the enlarged area to be aligned along the same line with the obstructed first layer wire. Then, the second layer wire which previously connected the two first layer wires is deleted.

31 Claims, 20 Drawing Sheets

```
Layer            ⟵ 7a
  LA    =   1   ;
  LB    =   2   ;
  via   =   3   ;
Width            ⟵ 7b
  LA    =   2.0 ;   a
  LB    =   2.0 ;   b
Gap              ⟵ 7c
  LA-LA =   3.0 ;   c
  LB-LB =   3.0 ;   d
```
7

Before Compacting

After Enlarging Process

After Replacing Process

First Layout Compacting

Second Layout Compacting

Third Layout Compacting

Before Second Layout Compacting

After Shifting Process

Before Third Layout Compacting

Reference Dot Setting Process

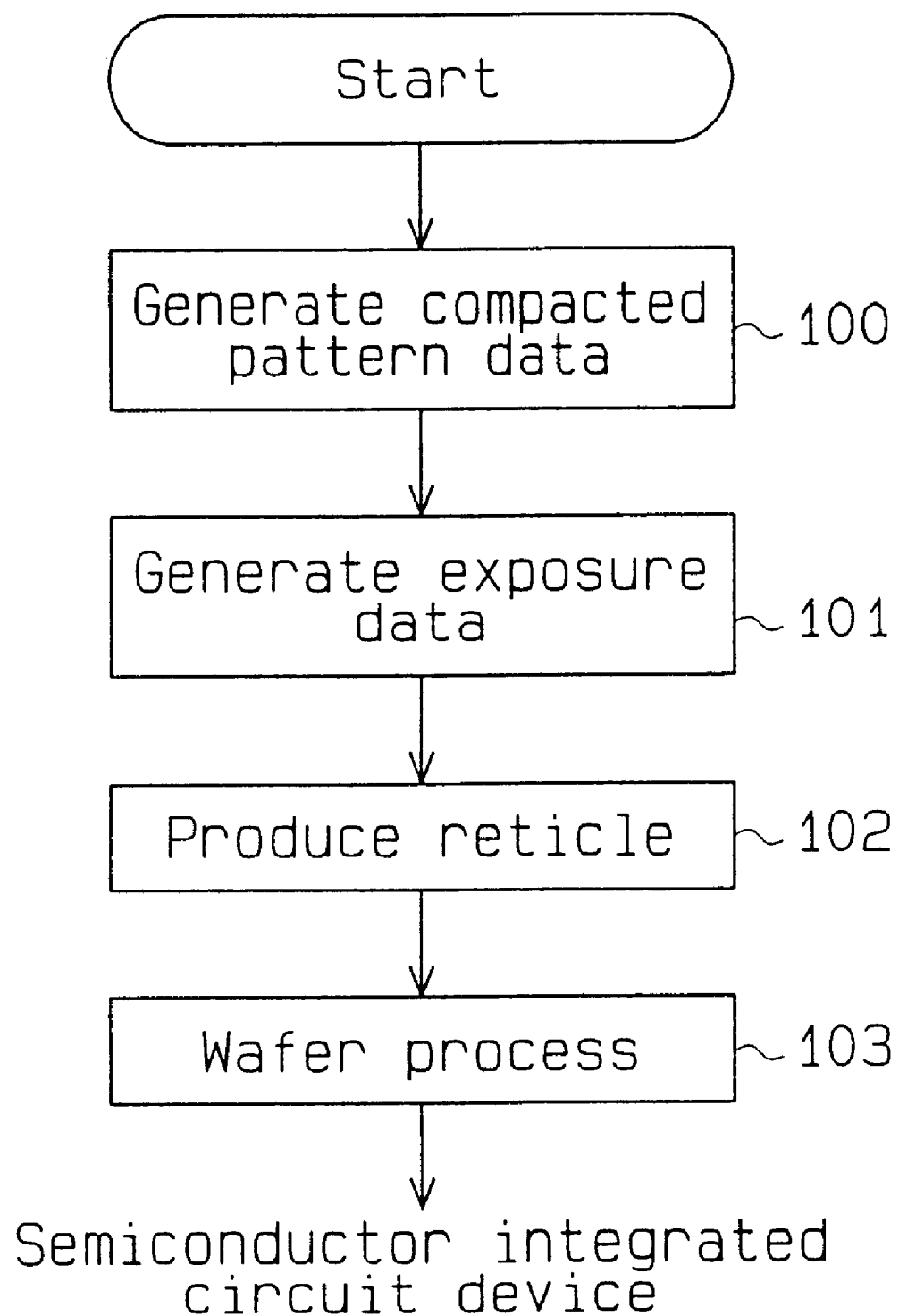

US 6,412,095 B1

METHOD AND APPARATUS FOR COMPACTING WIRING LAYOUT

BACKGROUND OF THE INVENTION

The present invention relates to a method for wiring layout and an apparatus for automating wiring layout in semiconductor integrated circuit devices, and more particularly, to a wiring layout method and an automated wiring layout apparatus that compacts and arranges wires efficiently.

In semiconductor integrated circuit devices, the increase in the amount of data and the number of bits for each data word has increased the number of signal wires that connect logic modules. Therefore, it is desirable that the signal wires be arranged efficiently to realize higher integration and higher processing speed of the semiconductor integrated circuit devices.

FIG. 1 shows an arrangement of modules 22 on a semiconductor substrate 21. The designing of a semiconductor integrated circuit device 20 involves determining the area allocated for each module 22 arranged on the substrate 21, forming a circuit element in each module 22, and placing and connecting the modules 22. Connecting the modules 22, or wiring layout, includes the process of laying out signal wires 23 and power wires between the modules 22.

Layout of the signal wires 23 is especially complicated and burdensome since the signal wires 23 must be arranged in a limited area, preferably with minimum wire lengths. In addition, high integration of the semiconductor integrated circuit device 20 has resulted in multilayer signal wires 23. This has caused the wiring layout of the signal wires 23 to be further complicated and thus further burdensome.

An automated wiring layout apparatus provided with a computer aided design tool is used to accomplish efficient and accurate wiring layout within a short period of time. A typical automated wiring layout apparatus processes an actual wiring pattern laid out by an operator to generate a wiring pattern having minimized wiring length and wiring volume.

FIG. 2 shows an actual pattern of a prior art wiring layout. FIG. 3 shows an actual pattern of a compacted wiring layout generated by compacting the wiring layout of FIG. 2 with a conventional automated wiring layout apparatus. As shown in FIG. 2, a first wiring L1 is formed by a lower layer wire LA1$a$, an upper layer wire LB1$a$, and a contact CT1$a$. A second wiring L2 is formed by three lower layer wires LA2$a$, LA2$b$, LA2$c$, two upper layer wires LB2$a$, LB2$b$, and four contacts CT2$a$, CT2$b$, CT2$c$, CT2$d$. A third wiring L3 is formed by a lower layer wire LA3$a$, an upper layer wire LB3$a$, and a contact CT3$a$.

The automated wiring layout apparatus identifies lower layer wires of other wirings that extend between the lower layer wires LA2$a$ and LA2$c$. The layout apparatus then connects the lower layer wires LA2$a$, LA2$c$ with a new lower layer wire, as shown in FIG. 3. This results in the second wiring L2 being formed by a single lower layer wire LA2$x$. Accordingly, the lower layer wire LA2$b$, the two upper layer wires LB2$a$, LB2$b$, and the four contacts CT2$a$, CT2$b$, CT2$c$, CT2$d$ become unnecessary. This shortens the wiring length and decreases the wiring volume of the second wiring L2. In addition, since the space that would be used for the lower layer wire LA2$b$ and the contacts CT2$b$, CT2$c$ becomes free, the length of the actual pattern shown in FIG. 2 in the vertical direction is shortened. That is, a compacted actual pattern is obtained. This enables the other wirings to be routed with less restrictions.

However, the prior art layout apparatus has limitations to the compacting of the wirings. FIG. 4 shows an example of such a limitation. An actual pattern of wirings illustrated in FIG. 4 includes a first wiring L1 formed by a lower layer wire LA1$a$, an upper layer wire LB1$a$, and a contact CT1$a$. A second wiring L2 is formed by three lower layer wires LA2$a$, LA2$b$, LA2$c$, two upper layer wires LB2$a$, LB2$b$, and four contacts CT2$a$, CT2$b$, CT2$c$, CT2$d$. A third wiring L3 is formed by a lower layer wire LA3$a$, an upper layer wire LB3$a$, and a contact CT3$a$. A fourth wiring L4 is formed by a lower layer wire LA4$a$, an upper layer wire LB4$a$, and a contact CT4$a$. To form the second wiring L2 with a single lower layer wire, the layout apparatus identifies the fourth wiring L4 (lower layer wire LA4$a$) as an obstacle. Therefore, the layout apparatus determines that further compacting is not possible. In this case, the operator must manually layout the wiring to further compact the actual pattern of FIG. 4. Such manual intervention requires a great amount of time.

Accordingly, it is an objective of the present invention to provide a method for compacting wiring layout and an apparatus for automated wiring layout that have enhanced compacting efficiency.

SUMMARY OF THE INVENTION

Briefly stated the present invention provides a method for compacting a wiring layout pattern. The pattern includes at least a first wiring and a second wiring, each wiring having a plurality of first layer wires extending in a first direction and a plurality of second layer wires extending in a second direction generally perpendicular to the first direction Two first layer wires of the same wiring are arranged at different locations and are connected to each other by a second layer wire. The method includes the steps of: a) identifying first layer wires of other wirings that interfere with a line extending from one of the two first layer wires in the first direction; b) forming an enlarged area between the obstructed first layer wire and the interfering first layer wire of the other wiring; c) shifting the other one of the two first layer wires to the enlarged area to be aligned along the same line with the obstructed first layer wire; d) setting the original layout area of the other one of the two first layer wire as an open area; and e) deleting the second layer wire previously connecting the two first layer wires.

The present invention also provides a method for compacting a wiring layout pattern including the steps of: a) searching for an open first area to which one of the two first layer wires of the same wiring is moved in the second direction without interfering with first layer wires of other wirings, wherein the second layer wire connecting the two first layer wires is not interfered with by second layer wires of other wirings; b) moving the one of the two first layer wires to the open area; c) extending the second layer wire connecting the two first layer wires in the second direction; and d) connecting the extended second layer wire with the moved first layer wire.

The present invention further provides a method for compacting a wiring layout pattern including the steps of: a) searching for an open area to which a first portion of one of the two first layer wires of the same wiring is moved in the second direction without interfering with first layer wires of other wirings; b) setting a layout prohibition area around a second layer wire of other wirings either if the second layer wire of the other wiring is located on a line extending from the second layer wire connecting the two first layer wires or if the second layer wire of the other wiring is located closer to the open area; c) setting a route to the open area for the second layer wire to be moved by bypassing the prohibition area, wherein the bypass route permits the layout of the second layer wire in the first direction and the second direction; d) moving the first portion of one of the two first layer wires to the open area; e) extending the second layer wire connecting the two first layer wires along the bypass route; and f) connecting the extended second layer wire to the moved first portion.

The present invention provides a method for producing semiconductor integrated circuit devices. The method includes the step of generating exposure data for first layer wires and second layer wires using a compacted wiring layout pattern generated by: a) identifying first layer wires of other wirings that interfere with a line extending from one of the two first layer wires in the first direction; b) forming an enlarged area between the obstructed first layer wire and the interfering first layer wire of the other wiring; c) shifting the other one of the two first layer wires to the enlarged area to be aligned along the same line with the obstructed first layer wire; d) setting the original layout area of the other one of the two first layer wire as an open area; and e) deleting the second layer wire connecting the two aligned first layer wires. The method further includes the steps of; forming a reticle based on the exposure data; preparing a semiconductor substrate having an element formed thereon; and employing the reticle to layout wirings on the semiconductor substrate.

The present invention provides a method for producing semiconductor integrated circuit devices. The method includes the step of generating exposure data for first layer wires and second layer wires using a compacted wiring layout pattern generated by: a) searching for an open first area to which one of the two first layer wires of the same wiring is moved in the second direction without interfering with first layer wires of other wirings, wherein the second layer wire connecting the two first layer wires is not interfered with by second layer wires of other wirings; b) moving the one of the two first layer wires to the open area; c) extending the second layer wire connecting the two first layer wires in the second direction; and d) connecting the extended second layer wire with the moved first layer wire. The method further includes the steps of; forming a reticle based on the exposure data; preparing a semiconductor substrate having an element formed thereon; and employing the reticle to layout wirings on the semiconductor substrate.

The present invention provides a method for producing semiconductor integrated circuit devices. The method includes the step of generating exposure data for first layer wires and second layer wires using a compacted wiring layout pattern generated by: a) searching for an open area to which a first portion of one of the two first layer wires of the same wiring is moved in the second direction without interfering with first layer wires of other wirings; b) setting a layout prohibition area around a second layer wire of other wirings either if the second layer wire of the other wiring is located on a line extending from the second layer wire connecting the two first layer wires or if the second layer wire of the other wiring is located closer to the open area; c) setting a route to the open area for the second layer wire to be moved by bypassing the prohibition area, wherein the bypass route permits the layout of the second layer wire in the first direction and the second direction; d) moving the first portion of one of the two first layer wires to the open area; e) extending the second layer wire connecting the two first layer wires along the bypass route; and f) connecting the extended second layer wire to the moved first portion. The method further includes the steps of forming a reticle based on the exposure data; preparing a semiconductor substrate having an element formed thereon; and employing the reticle to layout wirings on the semiconductor substrate.

The present invention provides a computer readable recording medium having a program code thereon to compact a wiring layout pattern. The program code executes a method including the steps of: a) identifying first layer wires of other wirings that interfere with a line extending from one of the two first layer wires in the first direction; b) forming an enlarged area between the obstructed first layer wire and the interfering first layer wire of the other wiring; c) shifting the other one of the two first layer wires to the enlarged area to be aligned along the same line with the obstructed first layer wire; d) setting the original layout area of the other one of the two first layer wire as an open area; and e) deleting the second layer wire connecting the two aligned first layer wires.

The present invention provides a computer readable recording medium having a program code thereon to compact a wiring layout pattern. The program code executes a method including the steps of: a) searching for an open first area to which one of the two first layer wires of the same wiring is moved in the second direction without interfering with first layer wires of other wirings, wherein the second layer wire connecting the two first layer wires is not interfered with by second layer wires of other wirings; b) moving the one of the two first layer wires to the open area; c) extending the second layer wire connecting the two first layer wires in the second direction; and d) connecting the extended second layer wire with the moved first layer wire.

The present invention provides a computer readable medium having a program code thereon to compact a wiring layout pattern. The program code executes a method including the steps of: a) searching for an open area to which a first portion of one of the two first layer wires of the same wiring is moved in the second direction without interfering with first layer wires of other wirings; b) setting a layout prohibition area around a second layer wire of other wirings either if the second layer wire of the other wiring is located on a line extending from the second layer wire connecting the two first layer wires or if the second layer wire of the other wiring is located closer to the open area; c) setting a route to the open area for the second layer wire to be moved by bypassing the prohibition area, wherein the bypass route permits the layout of the second layer wire in the first direction and the second direction; d) moving the first portion of one of the two first layer wires to the open area; e) extending the second layer wire connecting the two first layer wires along the bypass route; and f) connecting the extended second layer wire to the moved first portion.

The present invention provides a wiring layout apparatus for compacting a wiring layout pattern. The apparatus includes: an input/output device for outputting wiring layout pattern data; and a computer for receiving the wiring layout pattern data from the input/output device to generate grid data used to represent the wiring layout pattern on a grid frame. The computer uses the grid data for compacting the wiring layout pattern, and generates compacted wiring layout pattern data by: a) identifying first layer wires of other wirings that interfere with a line extending from one of the two first layer wires in the first direction; b) forming an enlarged area between the obstructed first layer wire and the interfering first layer wire of the other wiring; c) shifting the other one of the two first layer wires to the enlarged area to be aligned along the same line with the obstructed first layer wire; d) setting the original layout area of the other one of the two first layer wire as an open area; and e) deleting the second layer wire connecting the two aligned first layer wires.

The present invention provides a wiring layout apparatus for compacting a wiring layout pattern. The apparatus includes: an input/output device for outputting wiring layout pattern data; and a computer for receiving the wiring layout pattern data from the input/output device to generate grid data used to represent the wiring layout pattern on a grid frame. The computer uses the grid data for computing the compacting of the wiring layout, and generates compacted wiring layout pattern data by: a) searching for an open first area to which one of the two first layer wires of the same wiring is moved in the second direction without interfering with first layer wires of other wirings, wherein the second layer wire connecting the two first layer wires is not interfered with by second layer wires of other wirings; b) moving the one of the two first layer wires to the open area; c) extending the second layer wire connecting the two first layer wires in the second direction; and d) connecting the extended second layer wire with the moved first layer wire.

The present invention provides a wiring layout apparatus for compacting a wiring layout pattern. The apparatus includes: an input/output device for outputting wiring layout pattern data; and a computer for receiving the wiring layout pattern data from the input/output device to generate grid data used to represent the wiring layout pattern on a grid frame. The computer uses the grid data for computing the compacting of the wiring layout, and generates compacted wiring layout pattern data by: a) searching for an open area to which a first portion of one of the two first layer wires of the same wiring is moved in the second direction without interfering with first layer wires of other wirings; b) setting a layout prohibition area around a second layer wire of other wirings either if the second layer wire of the other wiring is located on a line extending from the second layer wire connecting the two first layer wires or if the second layer wire of the other wiring is located closer to the open area; c) setting a route to the open area for the second layer wire to be moved by bypassing the prohibition area, wherein the bypass route permits the layout of the second layer wire in the first direction and the second direction; d) moving the first portion of one of the two first layer wires to the open area; e) extending the second layer wire connecting the two first layer wires along the bypass route; and f) connecting the extended second layer wire to the moved first portion.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 25 is a flowchart illustrating the manufacturing process of a semiconductor integrated circuit device using the actual pattern data generated by first, second, and third layout compactings according to the present invention.

DETAILED DESCRIPTION OF THE PREFERRED EMBODIMENTS

Figure 1:
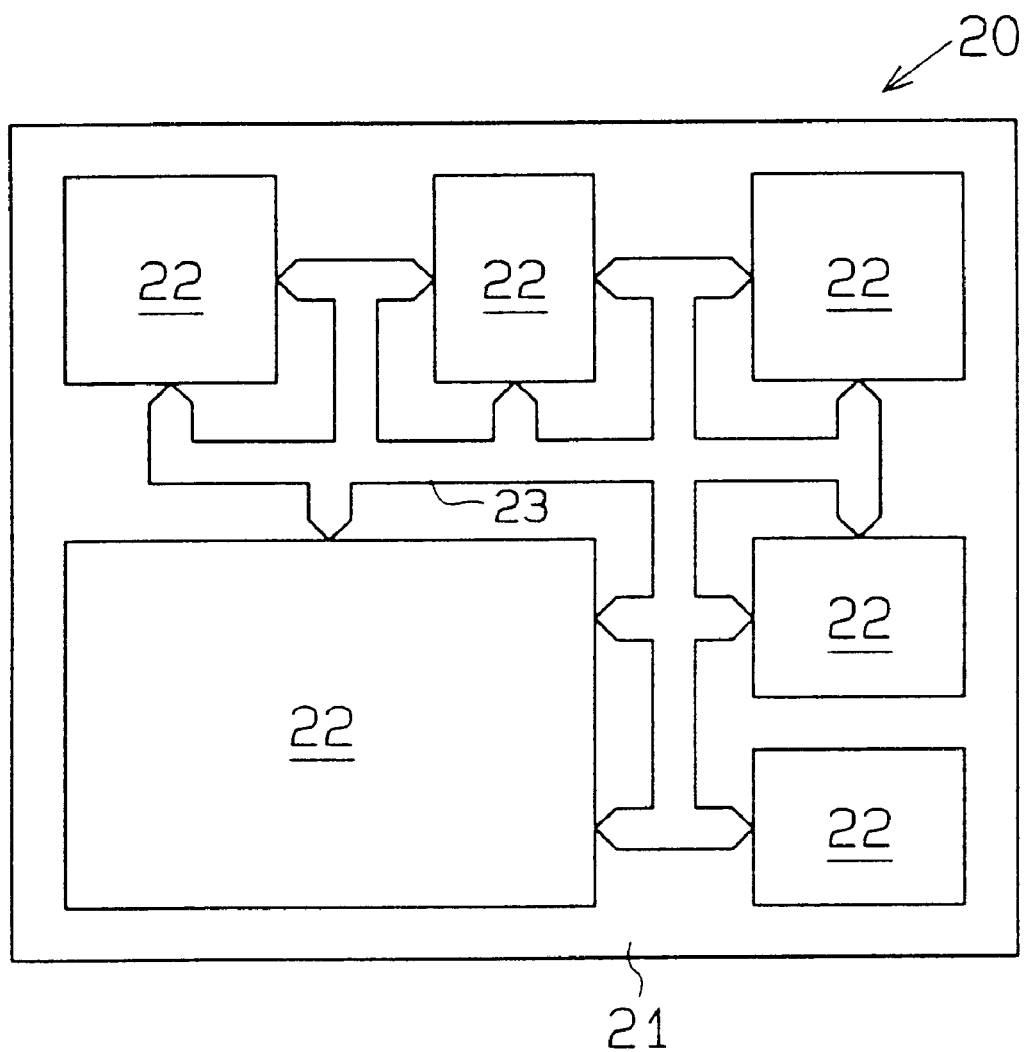
FIG. 1 is a schematic diagram showing a semiconductor integrated circuit device with modules formed on a semiconductor substrate.
Figure 2:
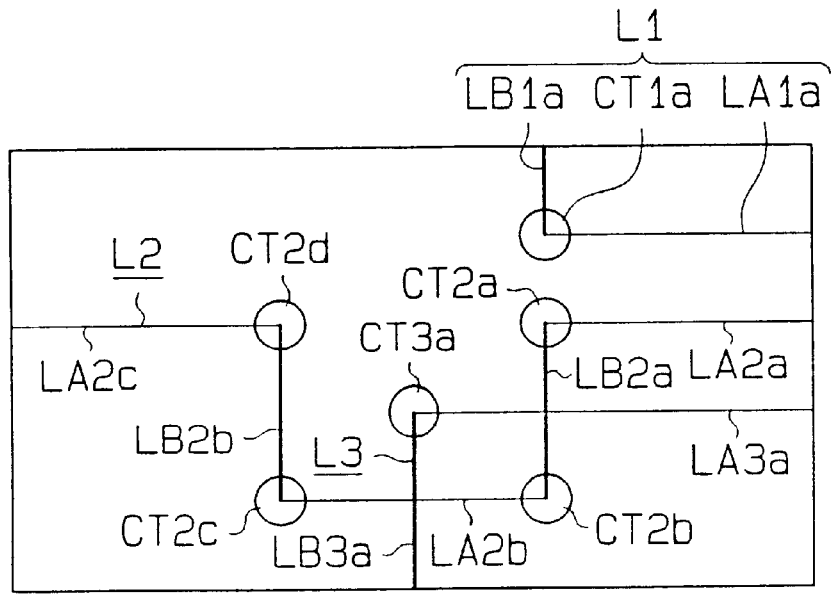
FIG. 2 is an actual pattern diagram showing a wiring layout before being compacted.
Figure 3:
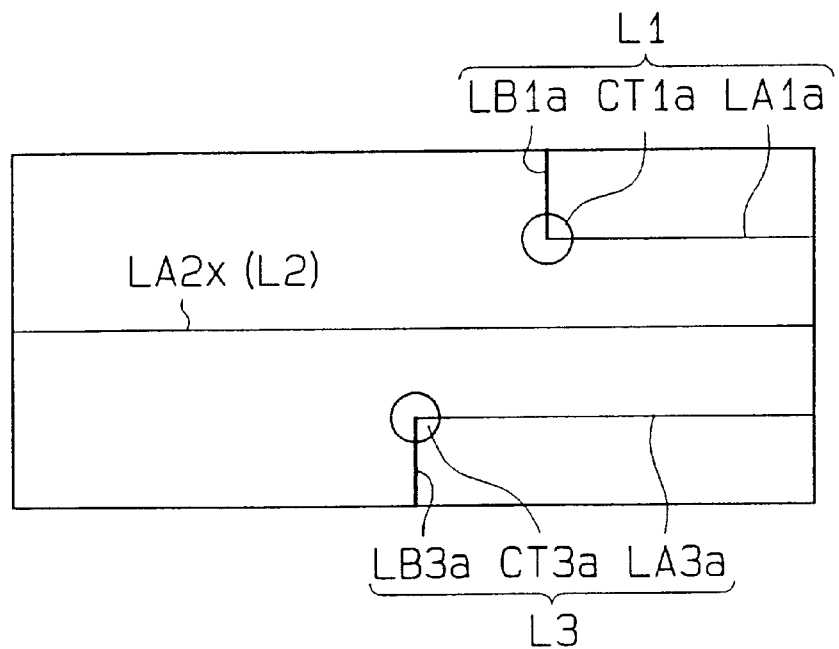
FIG. 3 is an actual pattern diagram showing the wiring layout of FIG. 2 compacted by a prior art automated wiring layout apparatus.
Figure 4:
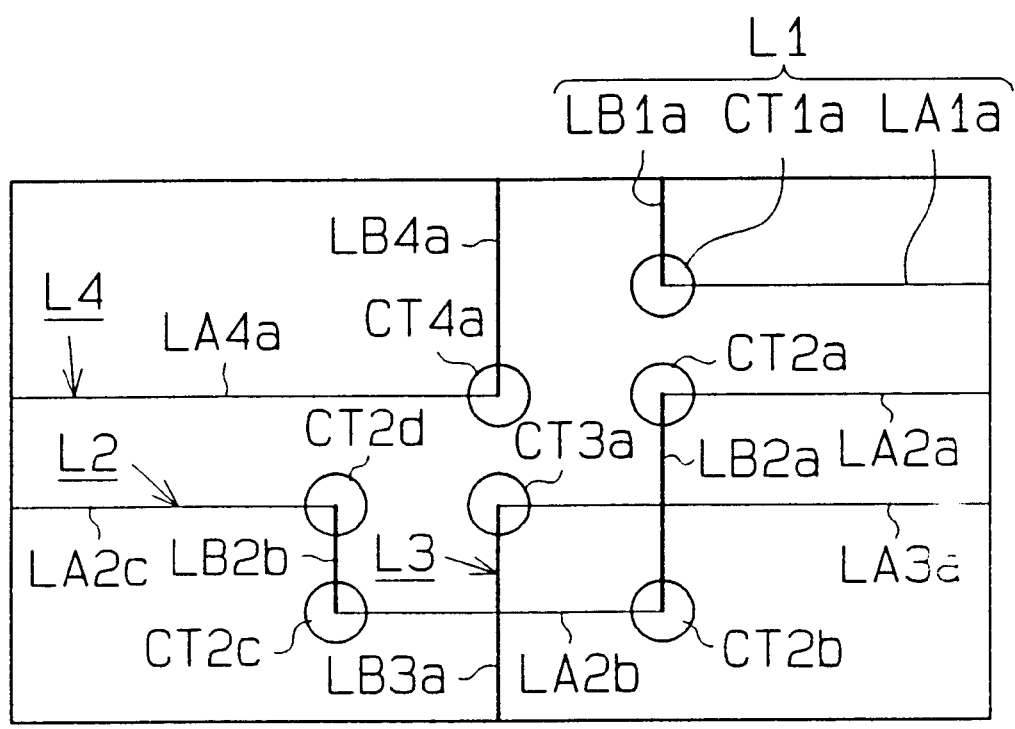
FIG. 4 is an actual pattern diagram showing a wiring layout that presents a limitation for compacting with the prior art automated wiring layout apparatus.
Figure 5:
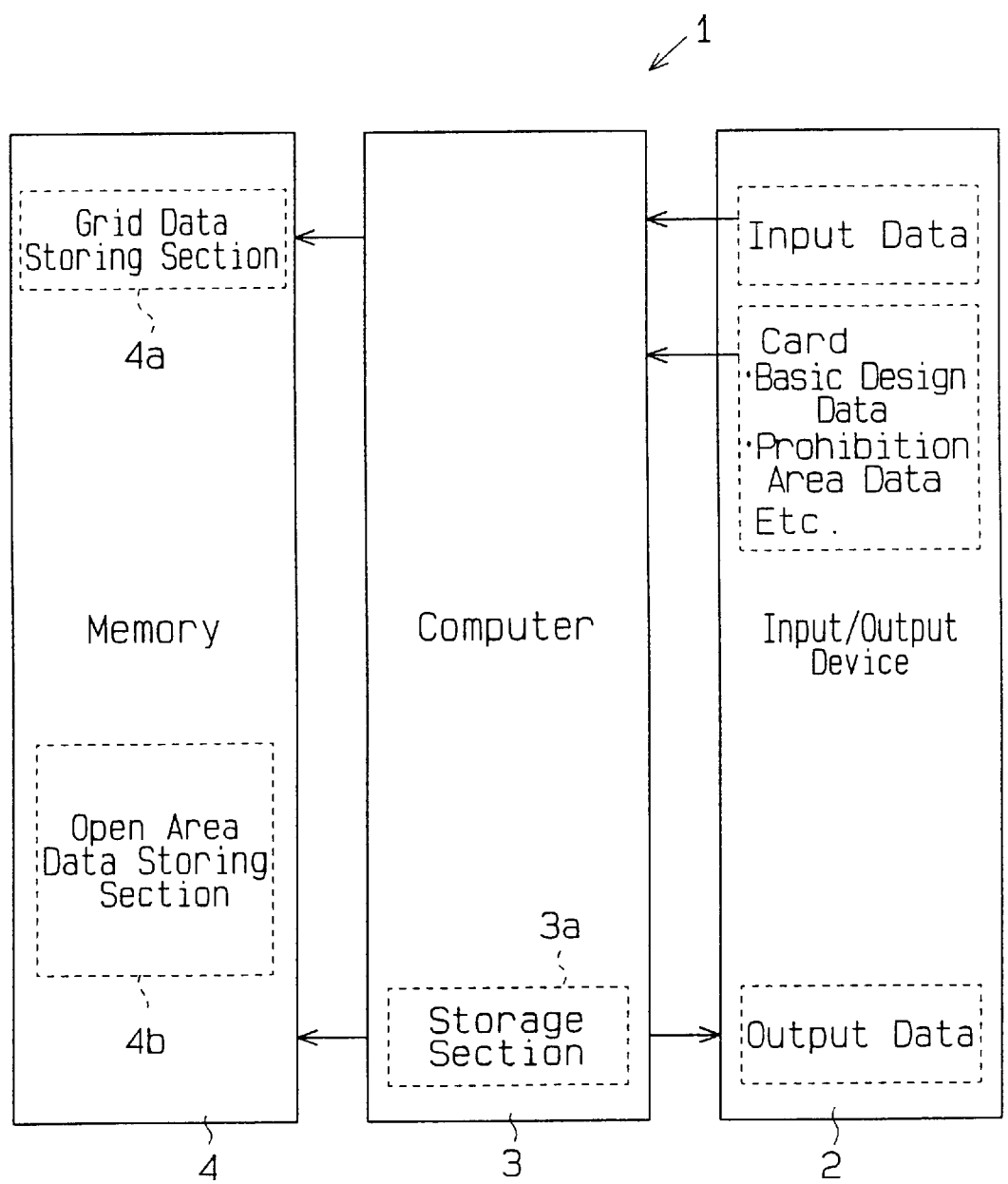
FIG. 5 is a schematic block diagram showing a first embodiment of an automated wiring layout apparatus according to the present invention.

An automated wiring layout apparatus 1 according to the present invention is shown in the schematic block diagram of FIG. 5. The automated wiring layout apparatus 1 includes an input/output device 2, a computer or processor 3, and a memory 4. The input/output device 2 preferably includes a keyboard, mouse, display device, printer, and/or a plotter. However, other input/output devices may also be included. The computer 3 may be a personal computer, a mainframe computer, a mid-frame computer, etc. The memory 4 may include ROM, RAM, magnetic, optical and other known memory devices.

Figure 11:
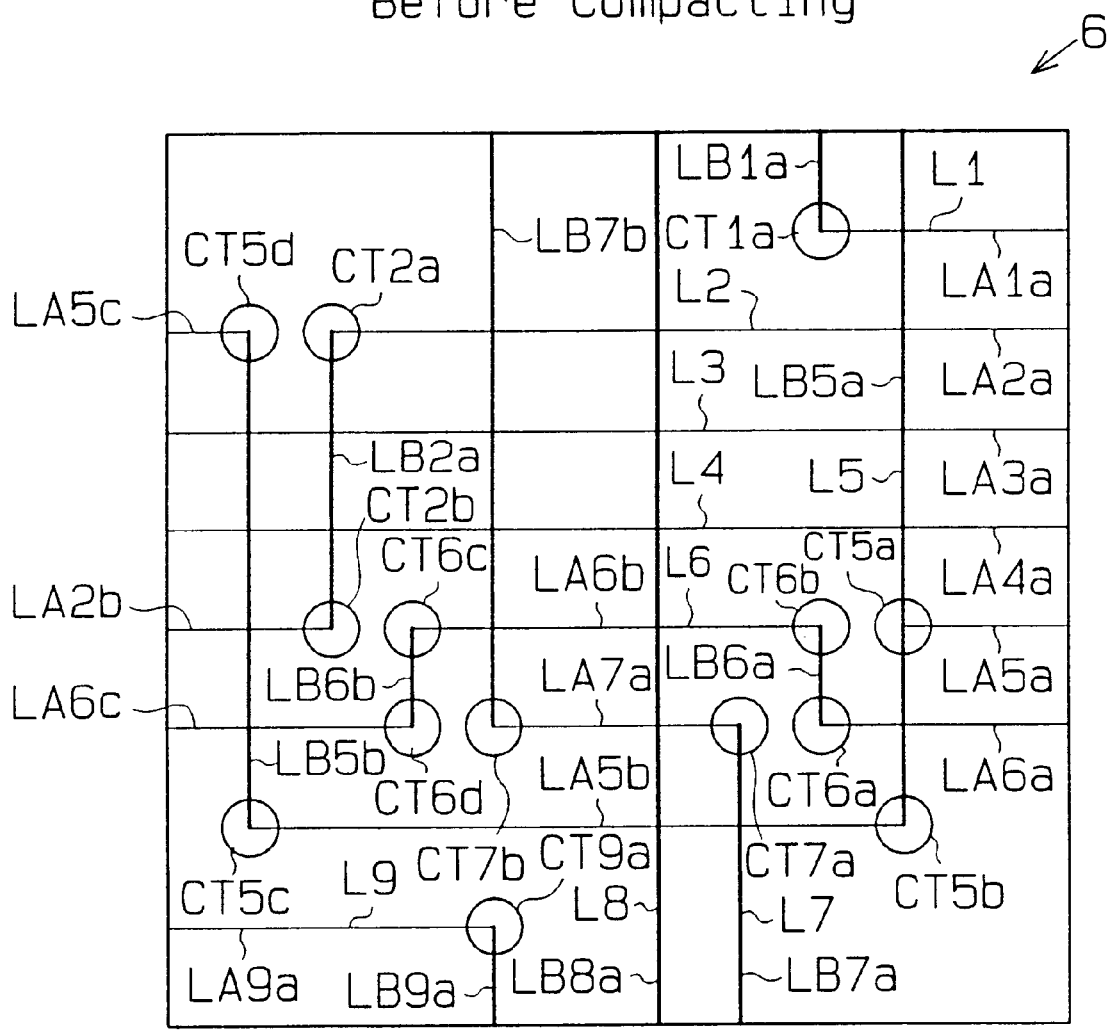
FIG. 11 is an actual pattern diagram showing a wiring layout before being compacted by the layout apparatus of FIG. 5.

The input/output device 2 sends input data to the computer 3. The input data includes data related to the wiring layout of an actual pattern 6, as shown in FIG. 11. More specifically, the wiring layout data includes data for each wiring, which is formed by lower layer wires, upper layer wires, and contacts. On a semiconductor substrate, upper layer wires and lower layer wires are insulated from each other by an insulation layer and connected to each other by a contact or via extending through the insulation layer. It is preferable that the upper layer wires and the lower layer wires extend perpendicular to each other. Although the invention is described herein in terms of two wiring layers, it will be understood by those of ordinary skill in the art that three or more layer designs may also be input and optimized by the present invention.

The actual pattern 6 shown in FIG. 11 shows the layout of nine wirings L1 to L9. The first wiring L1 is formed by a lower layer wire LA1$a$, an upper layer wire LB1$a$, and a contact CT1$a$. The second wiring L2 is formed by two lower layer wires LA2$a$, LA2$b$, an upper layer wire LB2$a$, and two contacts CT2$a$, CT2$b$. The third wiring L3 is formed by a lower layer wire LA3$a$. The fourth wiring L4 is formed by a lower layer wire LA4$a$. The fifth wiring L5 is formed by three lower layer wires LA5$a$, LA5$b$, LA5$c$, two upper layer wires LB5$a$, LB5$b$, and four contacts CT5$a$, CT5$b$, CT5$c$, CT5$d$. The sixth wiring L6 is formed by three lower layer wires LA6$a$, LA6$b$, LA6$c$, two upper layer wires LB6$a$, LB6$b$, and four contacts CT6$a$, CT6$b$, CT6$c$, CT6$d$. The seventh wiring L7 is formed by a lower layer wire LA7$a$, two upper layer wires LB7$a$, LB7$b$, and two contacts CT7$a$, CT7$b$. The eighth wiring L8 is formed by an upper layer wire LB8$a$. The ninth wiring L9 is formed by a lower layer wire LA9$a$, an upper layer wire LB9$a$, and a contact CT9$a$.

Figures 6, 7:
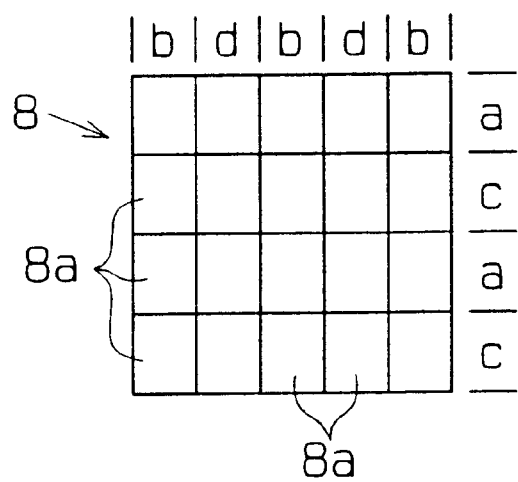
FIG. 6 is a diagram showing data recorded on an input card fed to an input/output device of the automated wiring layout apparatus of FIG. 5.
FIG. 7 is a grid frame showing a non-uniform grid employed by the layout apparatus of FIG. 5.

With reference to FIG. 5, the input/output device 2 sends basic design data to the computer 3. FIG. 6 shows the basic design data recorded on an input card 7. The basic design data includes layer data 7$a$, width data 7$b$, and gap data 7$c$. The layer data 7$a$ is used to define lower layer wires (LA), upper layer wires (LB), and vias. The via data is used to form the contacts. The width data 7$b$ designates the wiring width of the lower layer wires (LA) and the upper layer wires (LB). The gap data 7$c$ designates the gap between adjacent lower layer wires (LA) and the gap between adjacent upper layer wires (LB). In this case, two microns is recorded as the width data 7$b$ of the lower layer wire (LA) and the upper layer wire (LB) in the input card 7. Three microns is recorded as the gap data 7$c$ of the lower layer wire (LA) and the upper layer wire (LB). However, the width and the gap are not limited to two and three microns, respectively. Prohibited area data is also recorded in the input card 7. If a new upper layer wire (LB) is formed when layout compacting is carried out by the computer 3, the prohibited area data is used to prevent the new upper layer wire (LB) from interfering with and influencing other upper layer wires.

Returning to FIG. 5, the computer 3 forms a grid frame having non-uniform grids based on the basic design data. Grid data is generated from the formed grid frame and the actual pattern data. In other words, grid data is data that represents the actual pattern on a grid frame. The memory 4 has a grid data storing section 4$a$ to store the grid data generated by the computer 3.

FIG. 7 shows a grid frame 8, which is a matrix of dots 8$a$. A first group of the dots 8$a$ defined by the array on the first and third rows form two first areas a. A second group of the dots 8$a$ defined by the array on the second and fourth rows form two third areas C. A third group of the dots 8$a$ defined by the array on the first, third, and fifth columns form three second areas b. A fourth group of the dots 8$a$ defined by the array on the second and fourth columns form two fourth areas d.

Each first area a represents the area in which the layout of lower layer wires is permitted. The width of the first area a is determined by the width data 7$b$. If the width data 7$b$ shown in FIG. 6 is used, the width of the first area a is two microns. Each third area c represents the area that determines the gap between adjacent lower layer wires LA. The width of the third area c is determined by the gap data 7$c$ of lower layer wires LA. If the gap data 7$c$ shown in FIG. 6 is used, the width of the third area c is three microns. Each second area b represents the area in which the layout of upper layer wires is permitted. The width of the second area b is determined by the width data 7$b$. If the width data 7$b$ shown in FIG. 6 is used, the width of the second area b is two microns. Each fourth area d represents the area that determines the gap between adjacent upper layer wires LB. The width of the fourth area d is determined by the gap data 7$c$ of upper layer wires LB. If the gap data 7$c$ shown in FIG. 6 is applied, the width of the third area d is three microns.

Figure 8:
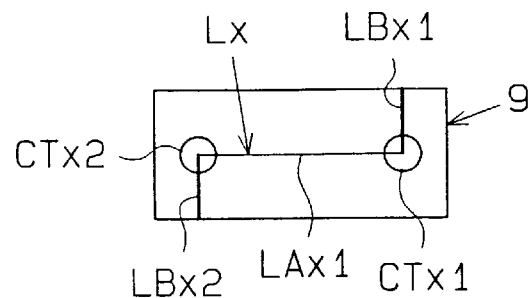
FIG. 8 is an actual pattern diagram showing a wiring.
Figure 9:
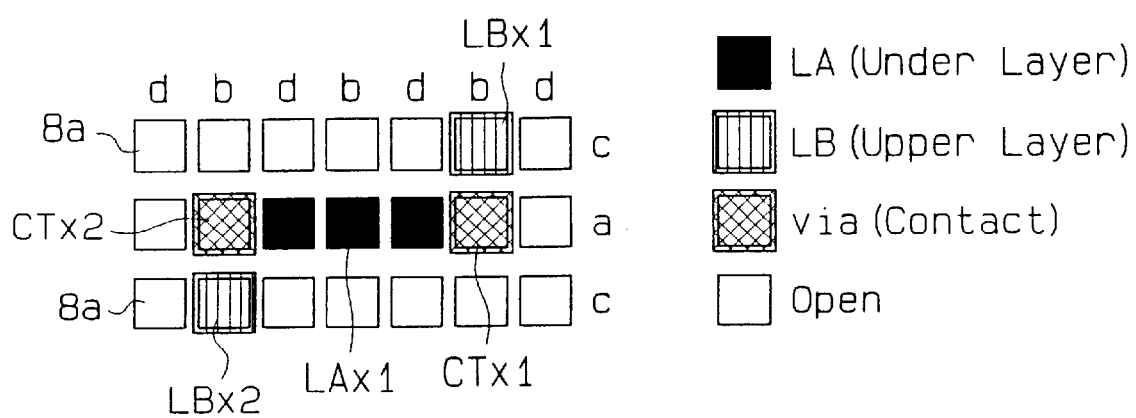
FIG. 9 is a diagram showing the wiring laid out on the grid frame of FIG. 7.

The grid data of an actual pattern 9 shown in FIG. 8 will now be described in detail. The actual pattern 9 includes a layout of a wiring Lx formed by a lower layer wire LAx1, two upper layer wires LBX1, LBX2, and two contacts CTx1, CTx2. As shown in FIG. 9, on the grid data, the lower layer wire LAx1 extends along the first area a, and the two upper layer wires LBx1, LBx2 extend along the corresponding second areas b. The vias, or the contacts CTx1, CTx2, connecting the upper layer wire LAx1 with the two upper layer wires LBx1, LBx2 are defined by the dots located at the corresponding intersections of the first area a and second areas b.

The dots 8$a$ that do not represent the upper layer wire, the lower layer wire, or the contacts are open. The computer 3 locates such open dots 8$a$ from the grid data of FIG. 9 and generates open area data that indicates the location of the open dots 8$a$. The memory 4 has an open area data storing section 4$b$ to store the open area data. The computer 3 uses the grid data stored in the memory 4 to carry out wiring layout compacting in accordance with the flowchart shown in FIG. 10. The compacting performed by the computer 3 includes first, second, and third layout compacting that are executed in accordance with a control program stored in a memory section 3$a$, in the computer 3. The memory section 3$a$ preferably comprises a recording or storage medium.

[A] First Layout Compacting

Figure 10:
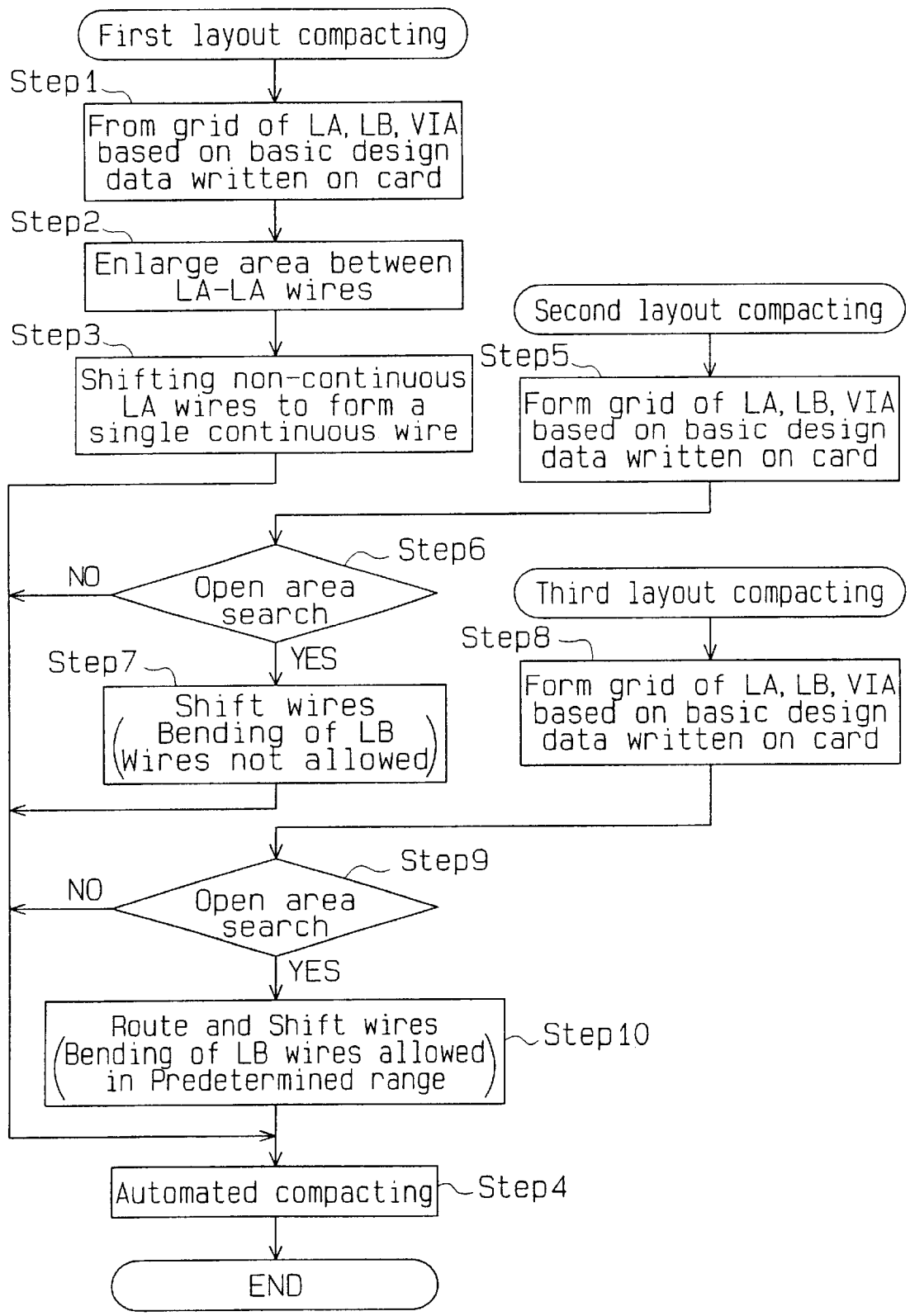
FIG. 10 is a flowchart illustrating the processing performed by the layout apparatus of FIG. 5.

The compacting of the actual pattern 6 of FIG. 11, that is, the layout of the nine wirings L1 to L9, will now be described. Referring to FIG. 10, at step 1, the computer 3 generates grid data by using the data of the actual pattern 6 and the grid frame 8. The first layout compacting of the actual pattern 6 will now be described with reference to FIGS. 11 to 14.

[A-1] Grid Enlarging Process

Figure 12:
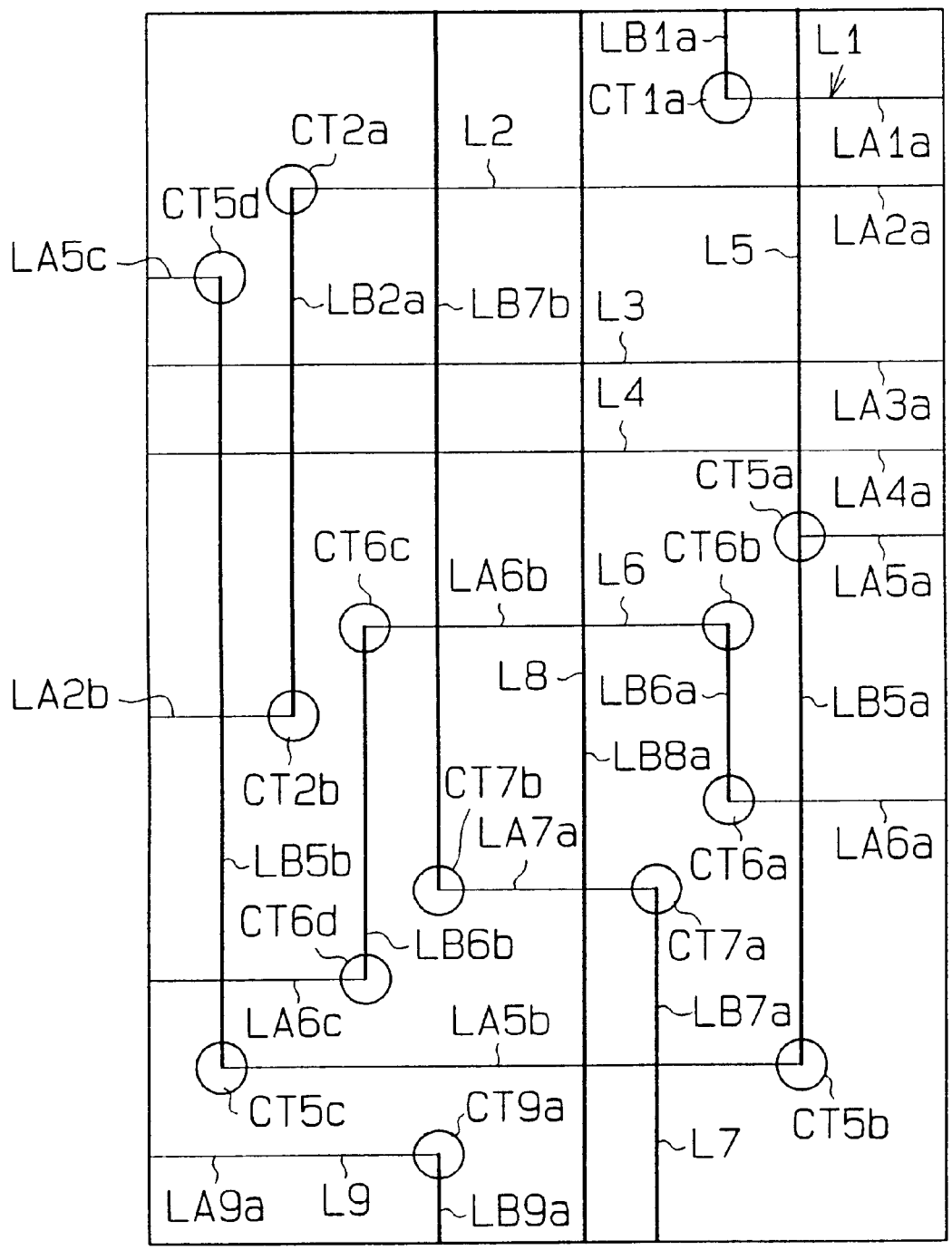
FIG. 12 is an actual pattern diagram showing the wiring layout of FIG. 11 after an enlarging process performed during a first layout compacting.
Figure 13:
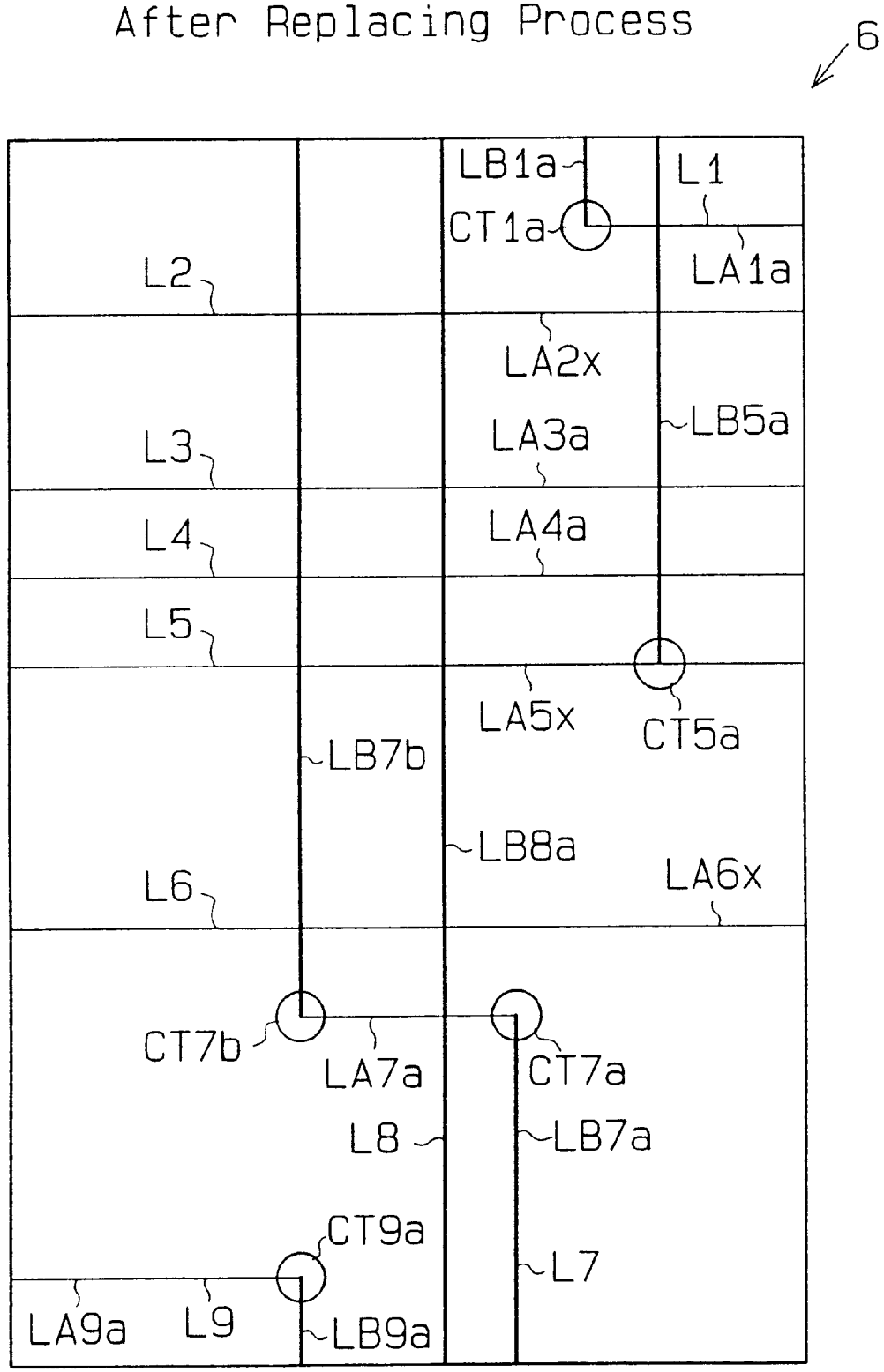
FIG. 13 is an actual pattern diagram showing the wiring layout of FIG. 11 after a shifting process of the first layout compacting.

At step 2, the computer 3 executes grid enlarging preferably in a direction perpendicular to the nine wirings L1 to L9, shown in FIG. 11, and confirms each wiring L1 to L9 and identifies lower layer wires that are obstacles to other lower layer wires. This step is performed beginning from the lower layer wire located at the uppermost position in FIG. 11. In this case, the identification of interfering lower layer wires is carried out from the lower layer wire LA1a. For lower layer wires extending horizontally at the same level, priority is preferably given to the rightward lower layer wire, as viewed in the drawing. Thus, in the layout of FIG. 11, the enlarging process is carried out in the order of the lower layer wire LA1a, the lower layer wire LA2a, the lower layer wire LA3a, the lower layer wire LA4a, the lower layer wire LA5a, the lower layer wire LA6a, the lower layer wire LA5b, the lower layer wire LA6b, the lower layer wire LA7a, the lower layer wire LA9a, the lower layer wire LA6c, the lower layer wire LA2b, and the lower layer wire LA5c. The wiring pattern 6 after enlarging is shown in FIG. 12.

The computer 3 first determines that a line extended from the lower layer wire LA1a would be clear of other lower layer wires. The computer 3 then proceeds to lower layer wire LA2a and determines that a line extended from the lower layer wire LA2a would be blocked by the lower layer wire LA5c. Hence, the computer 3 forms a first enlarged area between the lower layer wires LA2a, LA3a to move the lower layer wire LA5c downward (see FIG. 12). The first enlarged area has a width that permits the formation of a new lower layer wire. More specifically, the computer 3 adds a new first area a to the corresponding grid pattern (not shown) in correspondence with the first enlarged area and transfers the lower layer wire LA5c to the new first area a. This also forms a new third area c on the downward side of the new first area a.

The computer 3 then confirms that lines extended from the lower layer wires LA3a, LA4a are clear of other lower layer wires. A line extended from the lower layer wire LA5a would be blocked by the lower layer wires LA6b, LA2b. Thus, the computer 3 forms a second enlarged area between the lower layer wires LA5a, LA6a to move the lower layer wires LA6b, LA2b downward. More specifically, the computer 3 adds second new first area a and second new third area c to the grid pattern in correspondence with the second enlarged area and transfers the lower layer wires LA6b, LA2b to the second new first area C.

The computer 3 determines that a line extended from the lower layer wire LA6a would be blocked by the lower layer wires LA7a, LA6c. Therefore, a third enlarged area is formed between the lower layer wires LA6a, LA5b to move the lower layer wires LA7a, LA6c downward. More specifically, the computer 3 adds a third new first area a and a third new third area c to the grid pattern in correspondence with the third enlarged area and transfers the lower layer wires LA7a, LA6c to the third new first area c.

The computer 3 further determines that a line extended from the lower layer wire LA5b would be clear of other lower layer wires. A line extended from the lower layer wire LA6b would be blocked by the lower layer wire LA2b if extended. Thus, the computer 3 forms a fourth enlarged area between the lower layer wires LA6b, LA6a to move the lower layer wire LA2b downward. More specifically, the computer 3 adds a fourth new first area a and a fourth new third area c to the grid pattern in correspondence with the fourth enlarged area and transfers the lower layer wire LA2b to the fourth new first area C.

The computer 3 determines that a line extended from the lower layer wire LA7a would be blocked by the lower layer wire LA6c. Thus, the computer 3 forms a fifth enlarged area between the lower layer wires LA7a, LA5b to move the lower layer wire LA6c downward. More specifically, the computer 3 adds a fifth new first area a and a fifth new third area c to the grid pattern in correspondence with the fifth enlarged area and transfers the lower layer wire LA6c to the fifth new first area c.

Subsequently, the computer 3 sequentially determines that lines extended from the lower layer wires LA9a, LA6c, LA2b, LA5c would be clear of other lower layer wires and completes the enlarging process. The actual pattern 6 resulting from the enlarging is shown in FIG. 12. In the corresponding enlarged grid pattern, five new first areas a and five new third areas c are added to the pre-compacting grid pattern.

[A-2] Replacing Process

At step 3, the computer 3 combines lower layer wires to form a single lower layer wire. The replacing process is preferably conducted sequentially from wiring L1 to wiring L9. The computer 3 first determines that the first wiring L1 has only one lower layer wire LA1a and does not process the lower layer wire LA1a. The computer 3 then determines that the second wiring L2 has two lower layer wires LA2a, LA2b and that the lower layer wire LA2b extends to the left boundary of the actual pattern area. In this case, the computer 3 extends the left end of the lower layer wire LA2a to the left boundary and forms a new single lower layer wire LA2x. Thus, the unnecessary lower layer wire LA2b, the upper layer wire LB2a, and the two contacts CT2a, CT2b are deleted. Accordingly, the second wiring L2 is replaced by a wiring formed by the single lower layer wire LA2x.

The computer 3 then determines that the third wiring L3 has only one layer wire LA3a and that the fourth wiring L4 also has only one layer wire LA4a. Thus, the computer 3 does not process the wirings L3, L4 and proceeds to the next wiring L5. The fifth wiring L5 has three lower layer wires LA5a, LA5b, LA5c. Furthermore, the lower layer wire LA5c extends to the left boundary of the actual pattern area. Thus, the computer 3 extends the left end of the lower layer wire LA5a to the left boundary and forms a new single lower layer wire LA5x. The unnecessary lower layer wires LA5b, LA5c, the upper layer wire LB5b, and the three contacts CT5b, CT5c, CT5d are deleted. Furthermore, the portion of the upper layer wire LB5a extending downward from the contact CT5a is also eliminated. Accordingly, the fifth wiring L5 is replaced by a wiring formed by the lower layer wire LA5x, the upper layer wire LB5a, and the contact CT5a.

The computer 3 then determines that the sixth wiring L6 has three lower layer wires LA6a, LA6b, LA6c and that the lower layer wire LA6c extends to the left boundary of the actual pattern area. Thus, the computer 3 extends the left end of the lower layer wire LA6a to the left boundary and forms a new single lower layer wire LA6x. The unnecessary lower layer wires LA6b, LA6c, the upper layer wire LB6a, LB6b, and the four contacts CT6a, CT6b, CT6c, CT6d are deleted. Accordingly, the sixth wiring L6 is replaced by a wiring formed by the single lower layer wire LA6x.

Subsequently, the computer 3 proceeds to the seventh wiring L7 and determines that the seventh wiring L7 has only one lower layer wire LA7a. The lower layer wire LA7a is therefore not processed. The computer 3 then determines that the eighth wiring L8 does not include a lower layer wire and thus does not process the eighth wiring L8. Afterward, the computer 3 determines that the ninth wiring L9 has only one lower layer wire LA9a and thus does not process the ninth wiring L9. Consequently, when the replacing processing is completed, the grid pattern (not shown) has five first areas a that do not include a lower layer wire. These areas include the single first area a between the lower layer wire LA2x and the lower layer wire LA3a, the two first areas a between the lower layer wire LA5x and the lower layer wire LA6x, and the two first areas a between the lower layer wire LA7a and the lower layer wire LA9a.

[A-3] Compacting Process

At step 4, the computer 3 performs a compacting process to delete the five first areas a which do not have a lower layer wire. The computer 3 also eliminates the third area c on either the upper or bottom side of each deleted first area a. Thus, a total of five third areas c are eliminated. The computer 3 stores the grid data, generated by executing the compacting processing, in the memory 4 and sends the actual pattern data related to the grid data to the input/output device 2. This completes the compacting process of the first layout.

Figure 14:
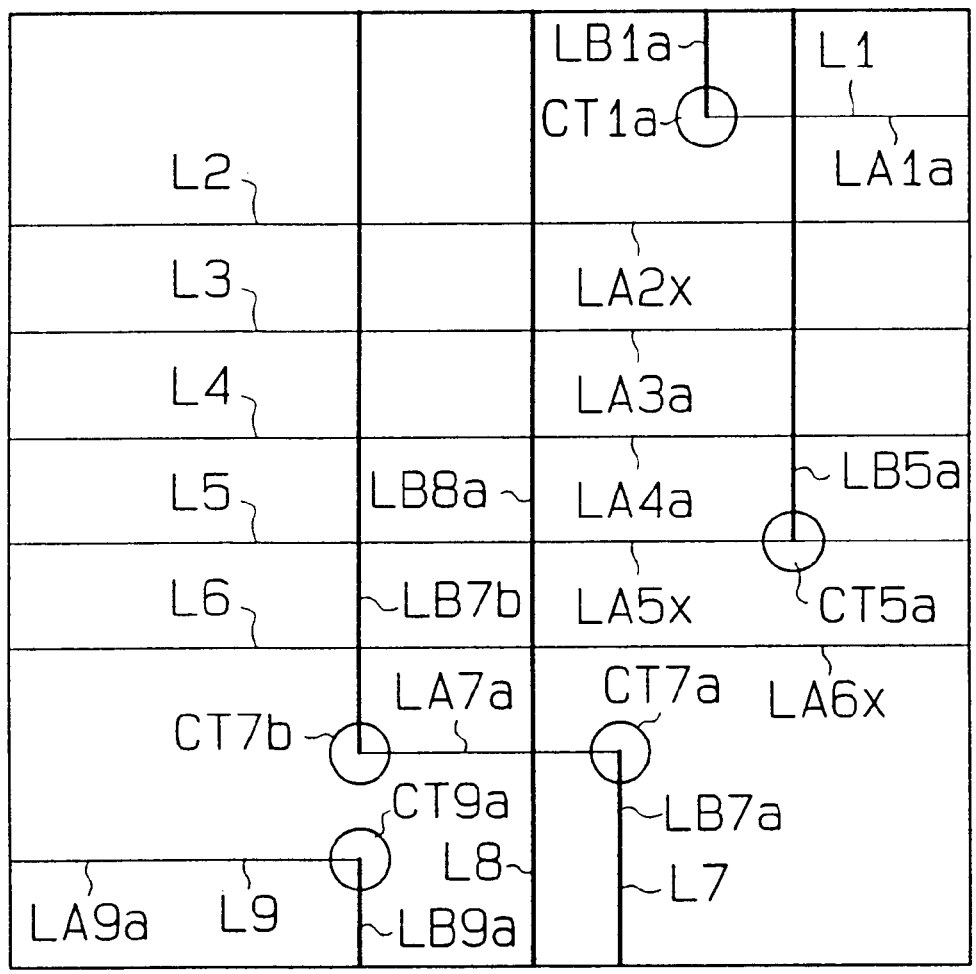
FIG. 14 is an actual pattern diagram showing the wiring layout of FIG. 11 after the first layout compacting.

FIG. 14 shows the pattern 6' after performing the compacting processing. The actual pattern 6' of FIG. 14 shows that at least one of the lower layer wires, upper layer wires, and contacts of the second, fifth, and sixth wirings L2, L5, L6 has been deleted during the compacting process. Accordingly, the grid data amount of the pattern 6' after the compacting process (FIG. 14) is smaller than that of the actual pattern 6 before the compacting processing (FIG. 11). Furthermore, the length of the second, fifth, and sixth wirings L2, L5, L6 are shortened. This also decreases the volume of the wirings L2, L5, L6.

The upper layer wires LB2a, LB5b, LB6b included in the actual pattern 6 before the compacting process are deleted in the compacted pattern 6', as shown in FIG. 14. Thus, the three unnecessary second areas b, one for each of the upper layer wires LB2a, LB5b, LB6b, are deleted. The computer 3 also deletes the fourth area d on either the left and right sides of each deleted second area b. That is, the computer 3 deletes three fourth areas d. As a result, the horizontal length of the compacted pattern 6' is shorter than that of the actual pattern 6. This enables the wirings and modules to be designed with less restrictions. This also further shortens the length of the lower layer wires LA2x, LA3a, LA4a, LA5x, LA6x, LA9a.

[B] Second Layout Compacting

Figure 17:
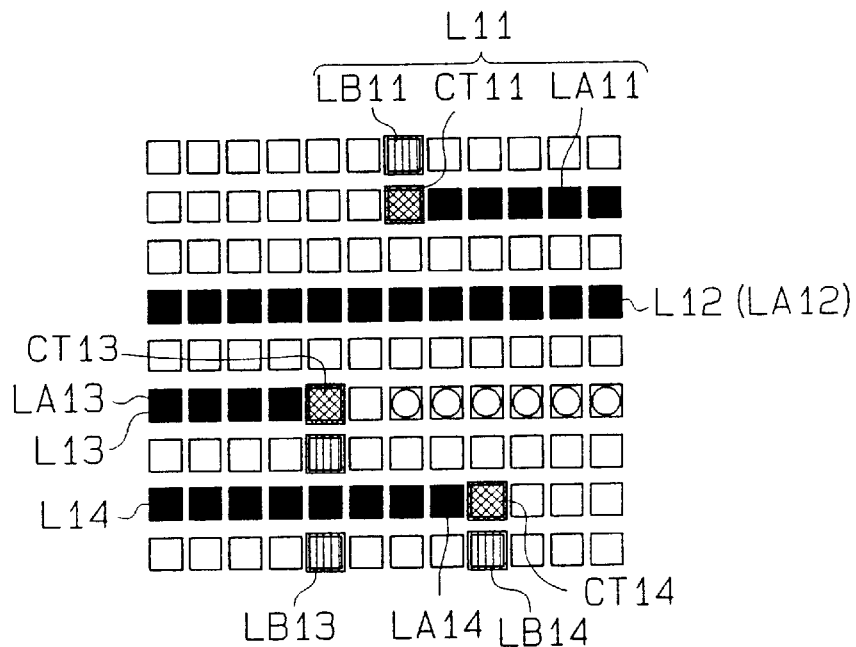
FIG. 17 is a diagram showing the grid pattern of the wiring layout of FIG. 11 before the second layout compacting.

A wiring layout of the grid data shown in FIG. 17 will be used to describe the second layout compacting. At step 5, the computer 3 generates grid data using the data of the compacted pattern 6' and the grid frame.

As shown in FIG. 17, the grid pattern includes four wirings (eleventh, twelfth, thirteenth, and fourteenth wirings L11, L12, L13, L14). The eleventh wiring L11 is formed by a lower layer wire LA11, an upper layer wire LB11, and a contact CT11. The twelfth wiring L12 is formed by a lower layer wire LA12. The thirteenth wiring L13 is formed by a lower layer wire LA13, an upper layer wire LB13, and a contact CT13. The fourteenth wiring L14 is formed by a lower layer wire LA14, an upper layer wire LB14, and a contact CT14.

[B-1] Open Area Searching Process

At step 6, the computer 3 performs an open area searching process to search for open areas in the grid pattern to shift lower layer wires to first areas a of other wirings. In this embodiment, the searching process is conducted from the uppermost lower layer wire shown in FIG. 17.

The computer 3 searches for open areas to which the lower layer wire LA11 may be shifted based on the open area data stored in the open area data storing section 4b of the memory 4. More specifically, the computer 3 searches for a first area a (open area) that does not include the lower layer wire LA11 and to which the entire lower layer wire LA11 may be shifted.

If the lower layer wire LA11 is shifted to an open first area a, the upper layer wire LB11 must be extended in accordance with the shifting. Thus, the computer 3 determines whether a line extended from the upper layer wire LB11 would be clear of other upper layer wires. If the upper layer wire LB11 would be interfered by other upper layer wires, the computer 3 determines that an open area has not been located. If the upper layer wire LB11 would be clear of other upper layer wires, the computer 3 determines that an open area has been located. In this case, an open area exists on the first area a of the lower wiring area LA13 (as indicated by circles in FIG. 17).

[B-2] Wiring Shifting Process

Figure 18:
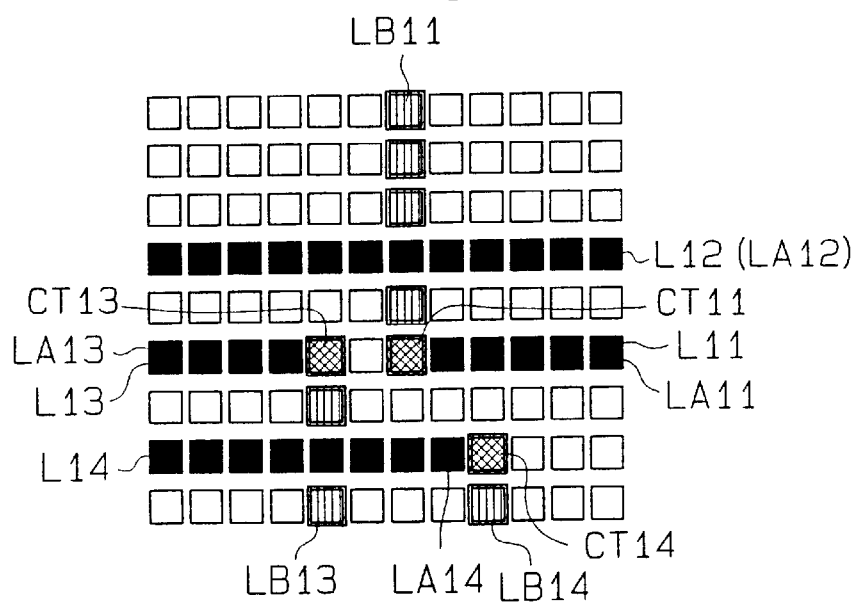
FIG. 18 is a diagram showing the grid pattern of the wiring layout of FIG. 11 after the shifting process of the second layout compacting.

At step 7, the computer 3 performs a wiring shifting process to move the lower layer wire LA11 to the open area. FIG. 18 shows the grid pattern after shifting the lower layer wire LA11 to the open area. When the lower layer wire LA11 is shifted to the open area, the upper layer wire LB11 is extended downward and the contact CT11 is shifted accordingly. Furthermore, the first area a in which the lower layer wire LA11 was formed becomes a new open area.

[B-3] Compacting Processing

At step 4, the computer 3 determines whether a lower layer wire exists in the first area a that originally included the lower layer wire LA11 before the shifting. In this example, other lower layer wires do not exist in the original first area a. Thus, the computer 3 deletes the original first area a. The computer 3 further deletes the third area located on either the upper and lower sides of the deleted first area a. The deletion of the first area a and the third area c decreases the size of the grid pattern after the compacting process. This shortens the length of the actual pattern in the direction parallel to the upper layer wires and enables the wirings and modules do be designed with less restrictions.

After determining whether there are open areas for each lower layer wire, the computer 3 compacts the actual pattern. After processing the last lower layer wire, the computer 3 stores the compacted grid pattern in the memory 4 and sends the actual pattern data related to the grid data to the input/output device 2.

Figure 15:
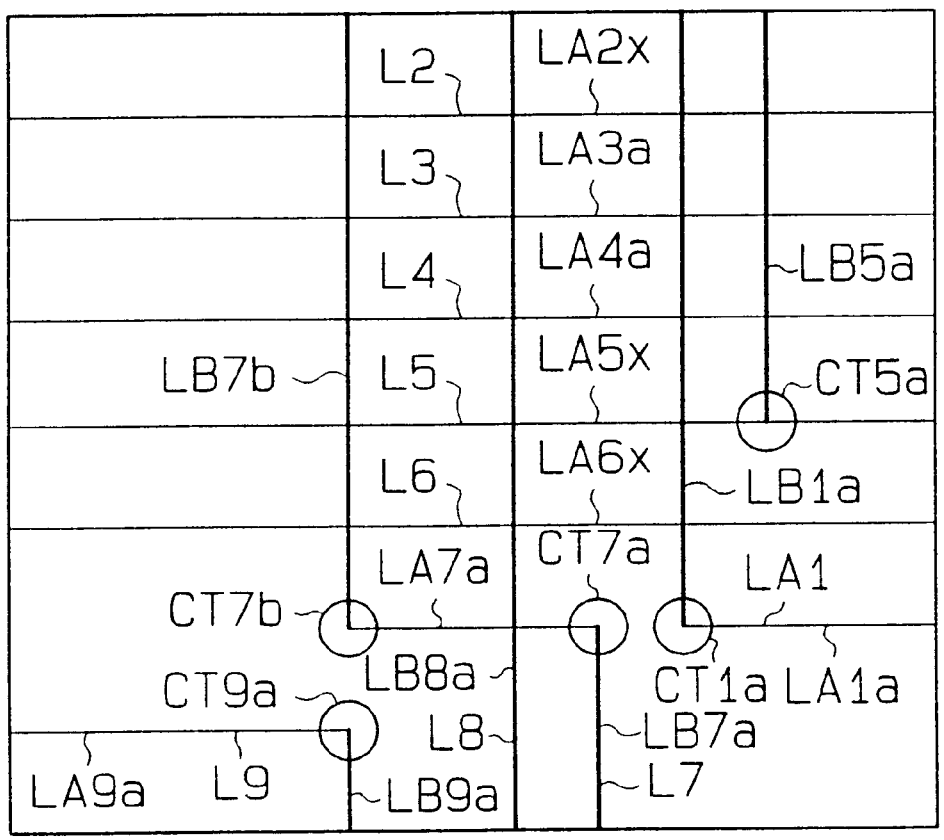
FIG. 15 is an actual pattern diagram showing the wiring layout of FIG. 11 after a second layout compacting.

The second layout compacting may be conducted on the actual pattern shown in FIG. 14, which was compacted during the first layout compacting. In this case, the number of upper layer wires is decreased during the first layout compacting thereby providing more open area. This increases the efficiency of the second layout compacting. FIG. 15 shows the pattern 6" generated when conducting both first and second layout compacting. As shown in the drawing, the lower layer wire LA1a is formed at the right side of the lower layer wire LA7a. Thus, the size of the actual pattern is further decreased.

[C] Third Layout Compacting

Figure 19:
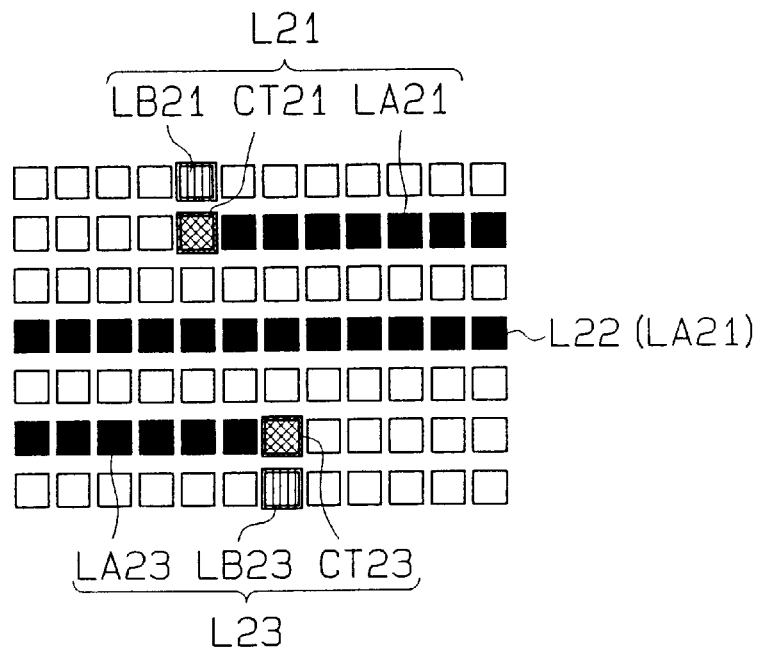
FIG. 19 is a diagram showing the grid pattern of the wiring layout of FIG. 11 before the third layout compacting.

A wiring layout of the grid data shown in FIG. 19 will be used to describe the third layout compacting. At step 8, the computer 3 generates grid data by using the data of the pattern 6" and the grid frame.

As shown in FIG. 19, the grid pattern includes three wirings (twenty-first, twenty-second, and twenty-third wirings L21, L22, L23). The twenty-first wiring L21 is formed by a lower layer wire LA21, an upper layer wire LB21, and a contact CT21. The twenty-second wiring L22 is formed by a lower layer wire LA22. The twenty-third wiring L23 is formed by a lower layer wire LA23, an upper layer wire LB23, and a contact CT23.

[C-1] open Area Searching Process

At step 9, the computer 3 conducts open space search processing. The computer 3 marks an open dot located adjacent to the contacts of the wirings L21, L22, L23 as a reference dot. In this example, an open dot adjacent to the contact CT21, CT23 is set as the reference dot.

Figure 20:
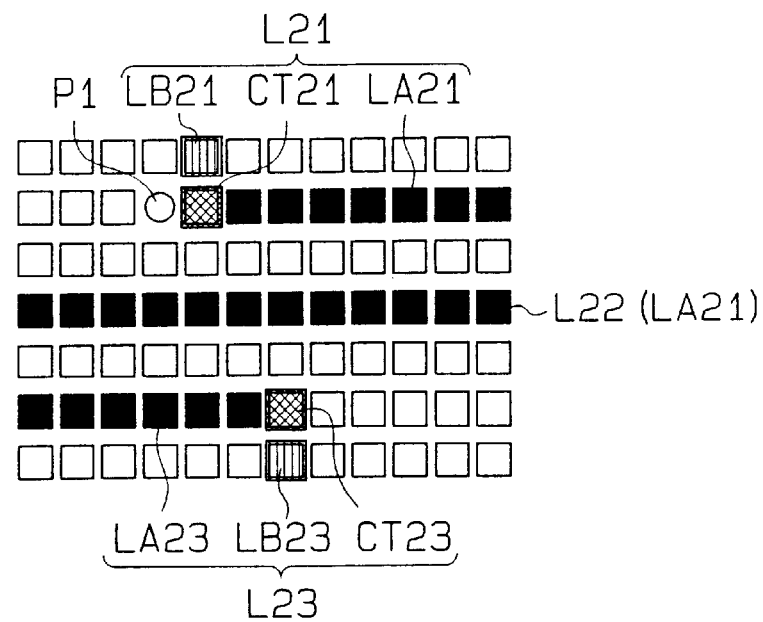
FIG. 20 is a diagram showing the grid pattern of the wiring layout of FIG. 11 with a reference dot set during the third layout compacting.
Figure 21:
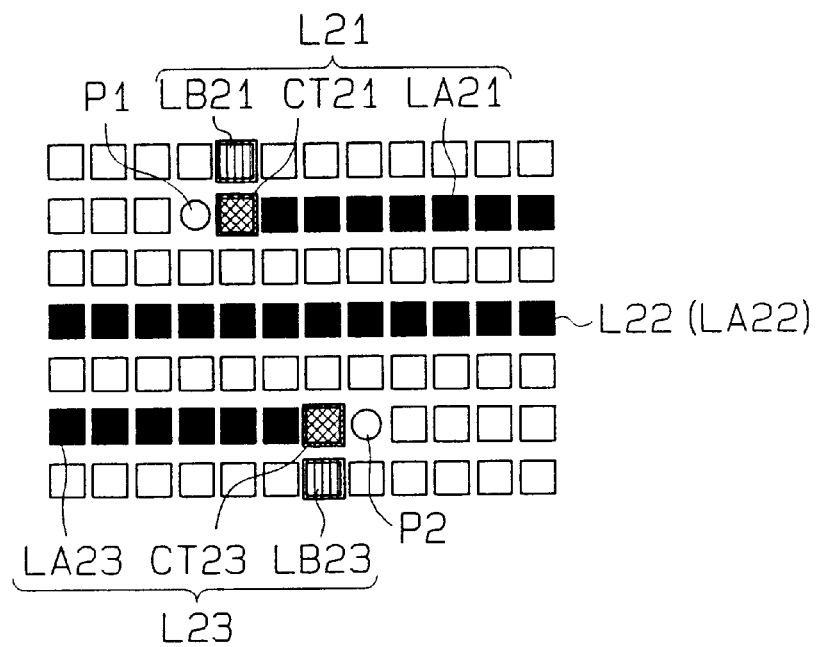
FIG. 21 is a diagram showing the grid pattern of the wiring layout of FIG. 11 for describing the search of open dots during the third layout compacting.

In the grid pattern shown in FIG. 19, the computer 3 locates the uppermost wiring L21 and marks the open dot on the left side of the contact CT21 as the reference dot (as indicated by the circle in FIG. 20). The computer 3 then searches for open dots that are included in first areas a of other wirings and located within a predetermined range around the reference dot P1 of the twenty-first wiring L21. The predetermined range is preferably a square range defined within four dots from the reference dot in lateral and vertical directions. In this case, the computer 3 locates open dot P2 (indicated by a circle in FIG. 21) in the predetermined range. The computer 3 then computes the number of continuous open dots starting from the dot next to the open dot P2. That is, the computer 3 computes the size of the open area. In FIG. 21, the open area is formed by four dots.

Figure 22:
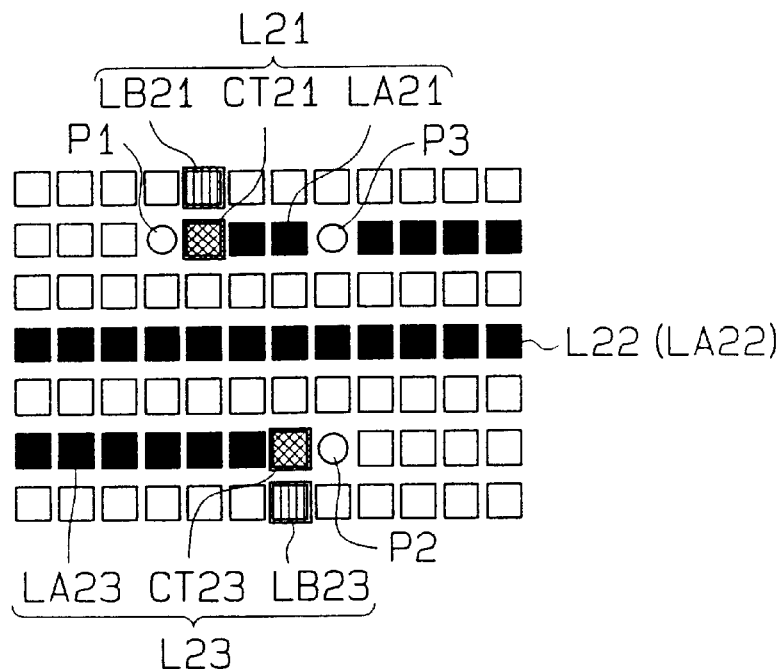
FIG. 22 is a diagram showing the grid pattern of the wiring layout of FIG. 11 with intersecting dots during the third layout compacting.

The computer 3 then locates the dot on the twenty-first wiring L21 at which a hypothetical line extending from the open dot P2 along the upper layer wire direction intersects. In this case, dot P3 is the intersecting dot (as indicated by a circle in FIG. 22). The computer 3 then computes the number of continuous open dots starting from the dot on the right side of the intersecting dot P3. That is, the computer 3 computes the size of the open area. Since the twenty-first wiring LA21 is included in this area as shown in FIG. 22, there is no open area.

The computer 3 compares the size of the open area related with the open dot P2 with the size of the open area related with intersecting dot P3. If the open area of the open dot P2 is larger than the open area of the intersecting dot P3, the computer 3 determines that a portion of the wiring LA21 may be formed on the open area of the open dot P2. If the open area of the open dot P2 is smaller than the open area of the intersecting dot P3, the computer 3 determines that the route of the wiring LA21 cannot be changed. In which case, the computer 3 proceeds to the next contact CT23 to perform the open area searching process.

[C-2] Wiring Routing Process

At step 10, the computer 3 performs routing and shifting of wirings. In the wiring routing process, the computer 3 shifts a portion of the lower layer wire LA21 to the open area related with the open dot P2. The contact CT21 is set as the initial point of the upper layer wire to which the portion of the shifted lower layer wire is connected.

Figure 23:
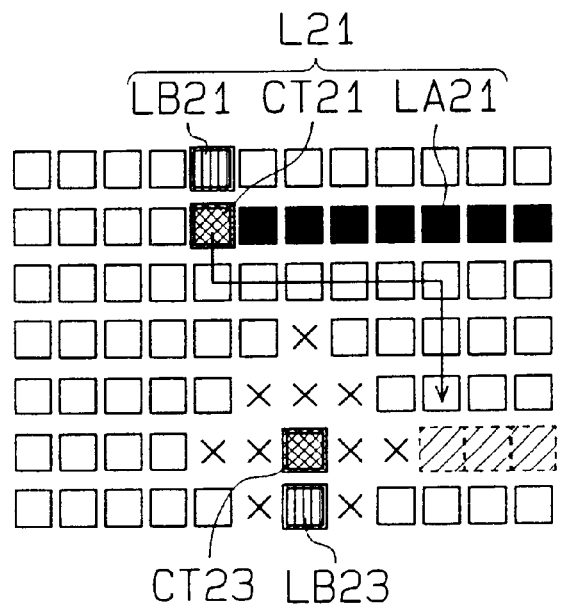
FIG. 23 is a diagram showing the grid pattern of the wiring layout of FIG. 11 with prohibited areas and wiring routes during the third layout compacting.

When a new upper layer wire is to be laid out, the computer 3 sets a routing prohibition area about the upper layer wire and contact that would be located in the vicinity of the new upper layer wire. The prohibition area extends within a predetermined range from the upper wiring layer and the contact. A grid pattern including the prohibition area, which is defined about the upper layer wire LB23 and contact CT23, is shown in FIG. 23. The prohibition area includes a first zone and a second zone. The first zone is defined by the two dots on each side of the dot of the upper layer wire LB23 (second area b) below the contact CT23. The second zone is defined by the eight dots located about the contact CT23 (left, right, and upper sides of and diagonally above the contact CT23). The dots included in the prohibition area are indicated by x-marks in FIG. 23.

The prohibition area shown in FIG. 23 is determined by the prohibition area data recorded on the input card 7. In this case, the data in the input card 7 designates the dot on each side of an upper layer wire, the two dots located on each of the left, right, and upper sides of a contact, and the two dots located diagonally upward from the contact as the prohibition area.

The computer 3 sets contact CT21 as the initial point and avoids the prohibition area to determine the route of the wiring. The contact CT21 is used as the initial point to prevent an increase in the number of contacts when rerouting wirings. The final point of the wiring route is selected from one of the three open dots (indicated by the shaded lines in FIG. 23) that are related to the open dot P2 and located outside the prohibition area. Among the three open dots, the dot that most shortens the length of the new upper layer wire is selected. If there is more than one route for the upper layer wire to connect the initial point to the final point, the wiring route having the minimum number of bends (minimum number of dots in the horizontal direction of the upper layer wire) is selected. The arrow shown in FIG. 23 indicates the route of the upper layer wire selected by the computer 3.

[C-3] Wiring Shifting

Figure 24:
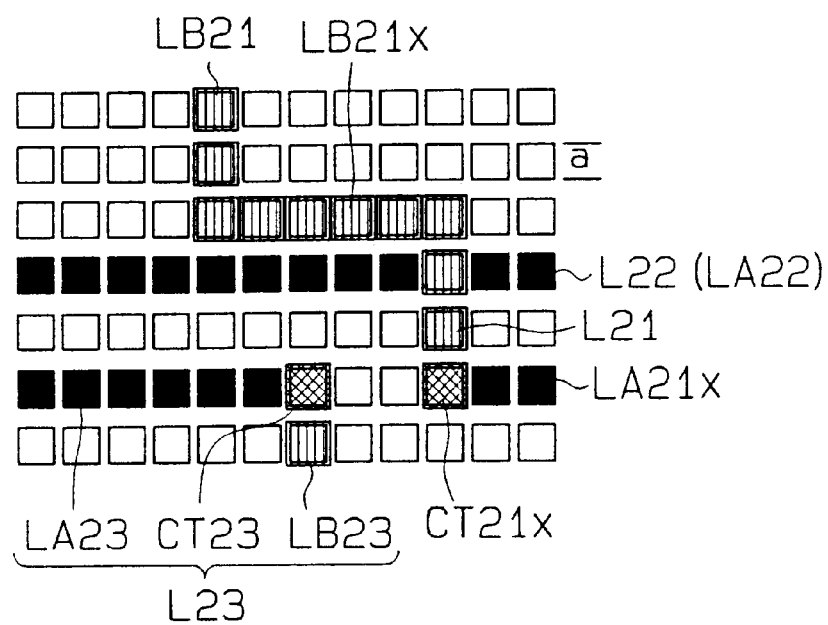
FIG. 24 is a diagram showing the grid pattern of the wiring layout of FIG. 11 after the shifting process during the third layout compacting.

The computer 3 shifts the lower wiring layer LA21 in accordance with the selected route and forms a new upper layer wire LB21x along the corresponding dots. The computer 3 then forms a new contact CT21x at the final dot of the upper layer wire LB21x. A new lower layer wire LA21x extending rightward from the final dot, as viewed in FIG. 24, is also formed. The computer 3 further deletes the lower layer wire LA21 and the contact CT21. The twenty-first wiring L21 is thus formed from the upper layer wires LB21, LB21x, the lower layer wire LA21x, and the contact CT21x.

[C-4] Compacting Process

In the grid pattern obtained after shifting the wirings, the deletion of the upper layer wire LA21 results in a first area a that does not include a lower layer wire. Thus, in step 4, the computer 3 deletes the first area a, which does not include a first area a, and the third area c located above the first area a. The compacting results in a grid pattern having a size that is smaller than the pre-compacted grid pattern of FIG. 19.

The computer 3 then proceeds to the twenty-third wiring L23 and carries out the reference dot setting process and then the open area searching process. The same processing is conducted on all of the remaining wirings. The compacted grid pattern is stored in the memory 4 and the pattern data included in the grid data is sent to the input/output device 2.

As shown in FIG. 19, the shifting of the lower layer wire LA21 may result in the lower layer wire overlapping the lower layer wire LA23. However, the third layout compacting routes the upper layer wire LB21x to shift only a portion of the lower layer wire LA21 (FIG. 24). Thus, the actual pattern is further compacted.

Figure 16:
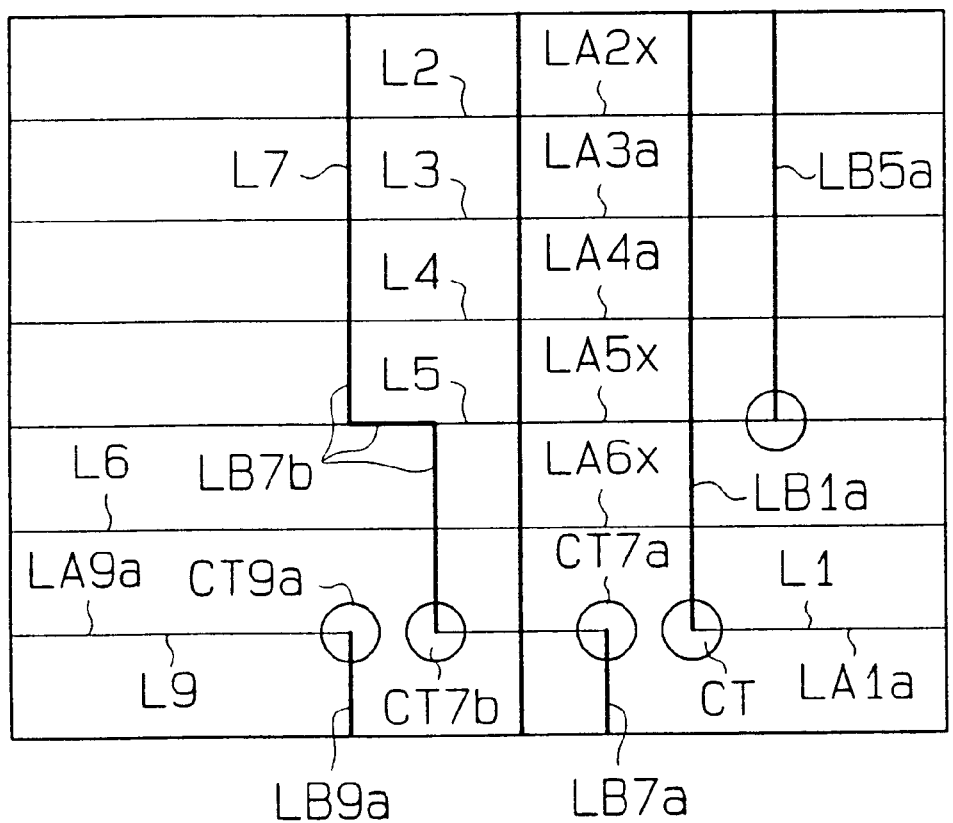
FIG. 16 is an actual pattern diagram showing the wiring layout of FIG. 11 after a third layout compacting.

When conducting the second layout compacting, the upper layer wire LB9a, shown in FIG. 15, may be located along a line extending from lower layer wire LB7b, as shown in FIG. 15. However, as shown in FIG. 16, the third compacting provides a new upper layer wire for the seventh wiring L7 to further decrease the size of the actual pattern.

The third layout compacting may be performed after the first layout compacting. In this case, the first layout compacting decreases the number of upper layer wires and increases the number of open areas. This increases the efficiency of the third layout compacting.

A flowchart of a semiconductor integrated circuit device manufacturing process employing the compacted actual pattern data is illustrated in FIG. 25. At step 100, the compacted pattern data is output from the input/output device 2 and sent to an exposure data generating device (not shown). The data generating device uses the compacted pattern data to generate exposure data (step 101). The exposure data is then used by a mask producing device (not shown) to produce a reticle (step 102). The reticle is used during a wiring step of a wafer process(step 103).

Figure 26A:
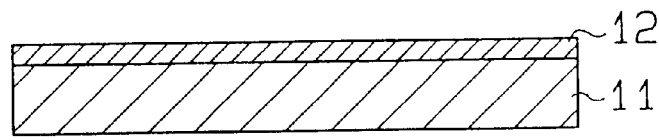
FIGS. 26(*a*) to 26(*l*) are schematic cross-sectional drawings each showing different wafer fabrication stages during the manufacturing process of FIG. 25.
Figure 26B:
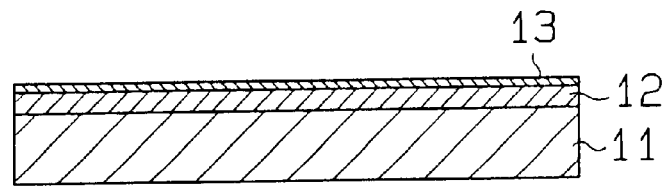
Figure 26C:
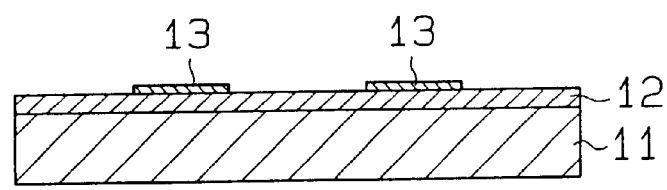
Figure 26D:
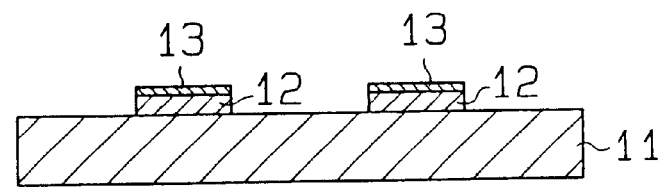
Figure 26E:
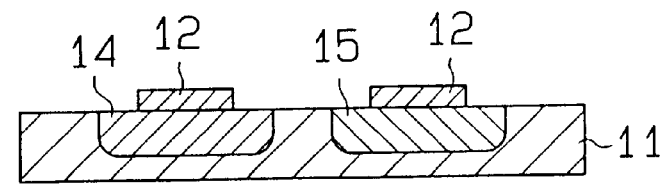
Figure 26F:
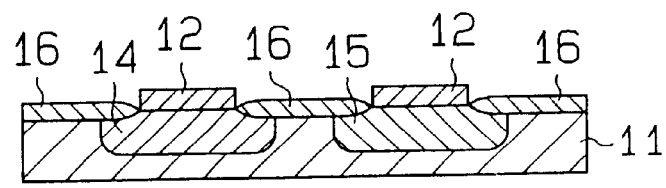

FIGS. 26(a) to 26(l) are schematic cross-sectional views of a MOS semiconductor integrated circuit device during different stages of wafer fabrication. A nitride film 12 is first formed on a p-type silicon wafer 11 by employing chemical vapor deposition (CVD), as shown in FIG. 26(a). A photoresistor 13 is then applied to the surface of the nitride film 12. The exposure device is employed to define patterns on the photoresistor 13 (FIG. 26(b)). The photoresistor 13 is developed to eliminate unnecessary portions of the photoresistor 13 (FIG. 26(c)). The nitride film 12 is then etched to form element separation regions (FIG. 26(d)). After removing the photoresistor 13, the wafer 12 is charged with ions to form channel stop portions 14, 15 (FIG. 26(e)). The wafer 11 then undergoes local oxidation to form a field oxide film 16 (FIG. 26(f)).

Figure 26G:
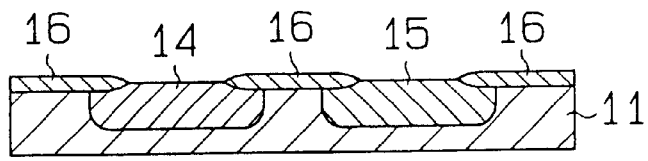
Figure 26H:
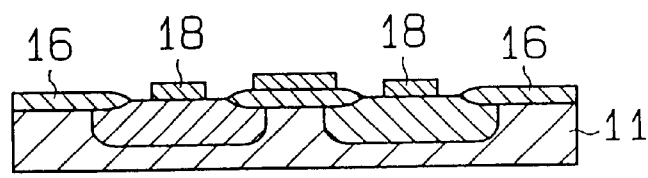
Figure 26I:
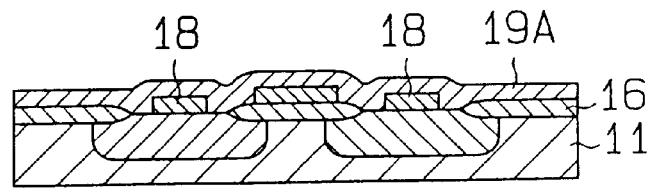
Figure 26J:
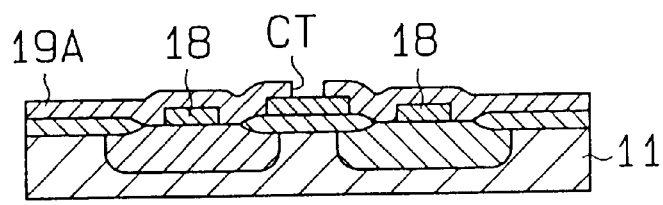
Figure 26K:
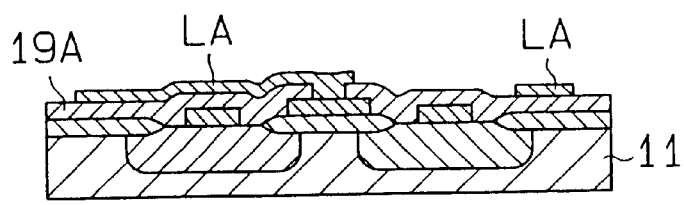

The nitride film 12 is etched to remove the oxide film (FIG. 26(g)). Polysilicon is then deposited on the wafer 11. The exposure device is used to define patterns on the polysilicon. Portions of the polysilicon are etched and removed to form gates 18. The wafer 11 is then charged with ions to form sources and drains (FIG. 26(h)). The silicon wafer 11 then undergoes thermal oxidation to form a layer insulation film 19A. Afterward, a contact hole CT is formed to connect the gates, sources, and drains with wirings (FIGS. 26(i) and 26(j)). The silicon wafer 11 undergoes physical vapor deposition to deposit aluminum. The exposure device then defines the patterns of the lower layer wire LA. Portions of the lower layer wire are etched and removed to form an aluminum lower layer wire LA (FIG. 26(k)). A reticle is used to form the lower layer wire LA.

Figure 26L:
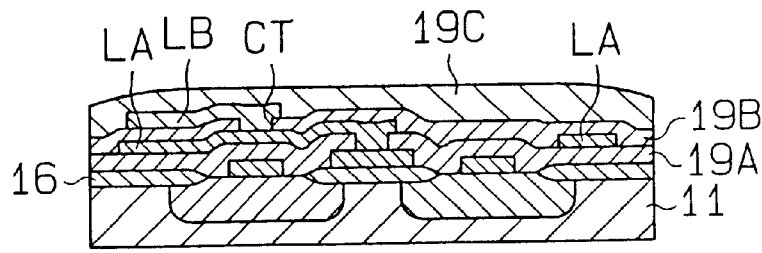

Thermal oxidation is then conducted to form a layer insulation film 19B (FIG. 26(l)). Afterward, a further contact hole CT, which electrically connects the lower layer wire LA with the upper layer wire LB, is formed. A reticle for forming the contact hole CT is used during the thermal oxidation. The silicon wafer 11 then undergoes physical vapor deposition to deposit aluminum and form an upper layer wire. The exposure device defines the patterns of the upper layer wire. Portions of the upper layer wire are etched and removed to form the aluminum upper layer wire LB (FIG. 26(l)). A reticle is used to form the upper layer wire LB. A protection film 19c is then applied to the silicon wafer 11. This completes wafer fabrication and produces a semiconductor integrated circuit device.

It should be apparent to those skilled in the art that the present invention may be embodied in many other specific forms without departing from the spirit or scope of the invention. Particularly, it should be understood that the invention may be embodied in the following forms.

In the preferred and illustrated embodiment, the present invention is applied to perform layout compacting of the signal wires 23 that connect the modules 22. However, the present invention may be embodied to carry out layout compacting of signal wires within each module. Furthermore, the application of the present invention is not limited to an automated wiring layout apparatus that performs the first, second, and third layout compactings. The present invention may also be embodied in a automated wiring layout apparatus that performs at least one of the first, second, and third compactings.

Therefore, the present examples and embodiments are to be considered as illustrative and not restrictive and the invention is not to be limited to the details given herein, but may be modified within the scope and equivalence of the appended claims.

What is claimed is:

1. A method for compacting a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, wherein the method comprises the steps of: a) arranging two first layer wires of the same wiring at different locations and being connected to each other by a second layer wire and identifying first layer wires that obstruct a line extending in the first direction from one of the two first layer wires of the first wiring;

b) forming an enlarged area between the first layer wire from which said line extends and the identified first layer wire that obstructs said line;

c) shifting the other one of the two first layer wires to the enlarged area to be aligned along said line, such that the two first layer wires of first wiring are connected to each other;

d) establishing an original layout area of the other one of the two first layer wires as an open area; and e) deleting the second layer wire previously connecting the two first layer wires and connecting the two first layer wires to form a single first layer wire.

2. The method according to claim 1 further comprising the steps of:

f) changing the two aligned first layer wires to one first layer wire; and g) deleting the open area when first layer wires are not included in the open area.

3. A method for compacting a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, two first layer wires of the same wiring being arranged at different locations and being connected to each other by a second layer wire, wherein the method comprises the steps of:

a) searching for an open first area to which one of the two first layer wires of a same wiring of one of the plurality of wirings is moved in the second direction without interfering with first layer wires of other writings of the plurality of wirings, wherein the second layer wire connecting the two first layer wires is not interfered with by second layer wires of other wirings;

b) moving the one of the two first layer wires to the open area;

c) extending the second layer wire connecting the two first layer wires in the second direction; and d) connecting the extended second layer wire with the moved first layer wire.

4. The method according to claim 3 further comprising the step of:

e) deleting an area in which the moved first layer wire had been arranged before being moved.

5. A method for compacting a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, two first layer wires of the same wiring being arranged at different locations and being connected to each other by a second layer wire, wherein the method comprises the steps of:

a) searching for an open area to which a first portion of one of the two first layer wires of a same wiring of one of the plurality of wirings is moved in the second direction without interfering with first layer wires of other wirings of one of the plurality of wirings;

b) establishing a layout prohibition area around a second layer wire of the other wirings either if the second layer wire of the other wiring is located on a line extending from the second layer wire connecting the two first layer wires of said same wiring or if the second layer wire of the other wiring is located on the open area;

c) establishing a route to the open area for the second layer wire to be moved by bypassing the prohibition area, wherein the bypass route permits the layout of the second layer wire in the first direction and the second direction;

d) moving the first portion of the one of the two first layer wires to the open area;

e) extending the second layer wire connecting the two first layer wires along the bypass route; and f) connecting the extended second layer wire to the moved first portion.

6. The method according to claim 5 further comprising the step of:

g) deleting the first layer wire that includes the first portion.

7. A method for compacting a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, the method comprising the steps of: a) arranging two first layer wires of the same wiring at different locations and being connected to each other by a second layer wire and performing a first wiring layout compacting process; and (b) performing a second wiring layout compacting process after the first wiring layout compacting process, wherein the first wiring layout compacting process includes the sub-steps of:

a-1) identifying first layer wires that interfere with a line extending from one of the two first layer wires of the first wiring in the first direction;

a-2) forming an enlarged area between the obstructed first layer wire of the first wiring and the interfering first layer wire;

a-3) shifting the other one of the two first layer wires of the first wiring to the enlarged area to be aligned along the same line with the obstructed first layer wire of the first wiring;

a-4) establishing an original layout area of the other one of the two first layer wires of the first wiring as an open area; and a-5) deleting the second layer wire previously connecting the two first layer wires of the first wiring and connecting the two first layer wires to form a single first layer wire;

and wherein the second wiring layout compacting process includes the sub-steps of:

b-1) searching for an open first area to which one of the two first layer wires of a same wiring is moved in the second direction without interfering with first layer wires of other wirings, wherein the second layer wire connecting the two first layer wires is not interfered with by second layer wires of other wirings;

b-2) moving the one of the two first layer wires to the open area;

b-3) extending the second layer wire connecting the two first layer wires in the second direction; and b-4) connecting the extended second layer wire with the moved first layer wire.

8. The method according to claim 7, wherein the first wiring layout compacting process further includes the sub-steps of:

a-6) changing the two aligned first layer wires to one first layer wire; and a-7) deleting the open area when other first layer wires are not included in the open area.

9. The method according to claim 7, wherein the second wiring layout compacting process further includes the sub-step of:

b-5) deleting the area in which the moved first layer wire had been arranged before being moved.

10. A method for compacting a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, wherein the method comprises the steps of: (a) arranging two first layer wires of the same wiring at different locations and being connected to each other by a second layer wire and performing a first wiring layout compacting process; and (b) performing a second wiring layout compacting process after the first wiring layout compacting process, wherein the first wiring layout compacting process includes the sub-steps of:

a-1) identifying first layer wires that interfere with a line extending from one of the two first layer wires of the first wiring;

a-2) forming an enlarged area between the obstructed first layer wire of the first wiring and the interfering first layer wire;

a-3) shifting the other one of the two first layer wires of the first wiring to the enlarged area to be aligned along the same line with the obstructed first layer wire of the first wiring;

a-4) establishing an original layout area of the other one of the two first layer wires of the first wiring as an open area; and a-5) deleting the second layer wire connecting the two aligned first layer wires of the first wiring and connecting the two first layer wires to form a single first layer wire;

and wherein the second wiring layout compacting process includes the sub-steps of:

b-1) searching for an open area to which a first portion of one of the two first layer wires of a same wiring is moved in the second direction without interfering with first layer wires of other wirings;

b-2) establishing a layout prohibition area around a second layer wire of the other wirings either if the second layer wire of the other wiring is located on a line extending from the second layer wire connecting the two first layer wires or if the second layer wire of the other wiring is located closer to the open area;

b-3) establishing a route to the open area for the second layer wire to be moved by bypassing the prohibition area, wherein the bypass route permits the layout of the second layer wire;

b-4) moving the first portion of one of the two first layer wires to the open area;

b-5) extending the second layer wire connecting the two first layer wires along the bypass route; and b-6) connecting the extended second layer wire to the moved first portion.

11. The method according to claim 10, wherein the first wiring layout compacting process further includes the sub-steps of:

-a-6) changing the two aligned first layer wires to one first layer wire; and a-7) deleting the open area when other first layer wires are not included in the open area.

12. The method according to claim 10, wherein the second wiring layout compacting process further includes the sub-step of:

b-7) deleting the first layer wire that includes the first portion.

13. A method for compacting a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, wherein the method comprises the steps of: (a) arranging two first layer wires of the same wiring at different locations and being connected to each other by a second layer wire and performing a first wiring layout compacting process;

(b) performing a second wiring layout compacting process after the first wiring layout compacting process; and (c) performing a third wiring layout compacting process after the second wiring layout compacting process, wherein the first wiring layout compacting process includes the sub-steps of:

a-1) identifying first layer wires that interfere with a line extending in the first direction from one of the two first layer wires of the first wiring;

a-2) forming an enlarged area between the obstructed first layer wire of the first wiring and the interfering first layer wire;

a-3) establishing the other one of the two first layer wires of the first wiring to the enlarged area to be aligned along the same line with the obstructed first layer wire of the first wiring;

a-4) establishing an original layout area of the other one of the two first layer wires of the first wiring as an open area; and a-5) deleting the second layer wire connecting the two aligned first layer wires of the first wiring and connecting the two first layer wires to form a single first layer wire;

wherein the second wiring layout compacting process includes the sub-steps of:

b-1) searching for a first open first area to which one of the two first layer wires of a same wiring is moved in the second direction without interfering with first layer wires of other wirings, wherein the second layer wire connecting the two first layer wires is not interfered with by second layer wires of other wirings;

b-2) moving the one of the two first layer wires to the first open area;

b-3) extending the second layer wire connecting the two first layer wires in the second direction; and b-4) connecting the extended second layer wire with the moved first layer wire;

and wherein the third wiring layout compacting process includes the sub-steps of:

c-1) searching for a second open area to which a first portion of one of the two first layer wires of the same wiring is moved in the second direction without interfering with first layer wires of other wirings;

c-2) establishing a layout prohibition area around a second layer wire of other wirings either if the second layer wire of the other wiring is located on a line extending from the second layer wire connecting the two first layer wires or if the second layer wire of the other wiring is located closer to the open area;

c-3) establishing a route to the open area for the second layer wire to be moved by bypassing the prohibition area, wherein the bypass route permits the layout of the second layer wire in the first direction and the second direction;

c-4) moving a first portion of one of the two first layer wires to the open area;

c-5) extending the second layer wire connecting the two first layer wires along the bypass route; and c-6) connecting the extended second layer wire to the moved first portion.

14. The method according to claim 13, wherein the first wiring layout compacting process further includes the steps of:

a-6) changing the two aligned first layer wires to one first layer wire; and a-7) deleting the open area when other first layer wires are not included in the open area.

15. The method according to claim 13, wherein the second wiring layout compacting process further includes the step of:

b-5) deleting the area in which the moved first layer wire had been arranged before being moved.

16. The method according to claim 13, wherein the third wiring layout compacting process further includes the step of:

c-7) deleting the first layer wire that includes the first portion.

17. A method for producing semiconductor integrated circuit devices, wherein the method comprises the steps of:

generating exposure data for first layer wires and second layer wires using a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, two first layer wires of the same wiring being arranged at different locations and being connected to each other by a second layer wire, by:

a) identifying first layer wires that interfere with a line extending in the first direction from one of the two first layer wires of the first wiring;

b) forming an enlarged area between the obstructed first layer wire of the first wiring and the interfering first layer wire of the other wiring;

c) establishing the other one of the two first layer wires of the first wiring to the enlarged area to be aligned along the same line with the obstructed first layer wire of the first wiring;

d) setting the original layout area of the other one of the two first layer wires of the first wiring as an open area; and e) deleting the second layer wire connecting the two aligned first layer wires of the first wiring and connecting the two first layer wires to form a single first layer wire;

forming a reticle based on the exposure data;

preparing a semiconductor substrate having an element formed thereon; and employing the reticle to layout wirings on the semiconductor substrate.

18. A method for producing semiconductor integrated circuit devices, wherein the method comprises the steps of:

generating exposure data for first layer wires and second layer wires using a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, two first layer wires of the same wiring being arranged at different locations and being connected to each other by a second layer wire, compacting the wiring layout pattern by:

a) searching for an open first area to which one of the two first layer wires of a same wiring is moved in the second direction without interfering with first layer wires of other wirings, wherein the second layer wire connecting the two first layer wires of said same wiring is not interfered with by second layer wires of said other wirings;

b) moving the one of the two first layer wires of said same wiring to the open area;

c) extending the second layer wire connecting the two first layer wires of said same wiring in the second direction; and d) connecting the extended second layer wire of said same wiring with the moved first layer wire;

forming a reticle based on the exposure data;

preparing a semiconductor substrate having an element formed thereon; and employing the reticle to layout wirings on the semiconductor substrate.

19. A method for producing semiconductor integrated circuit devices, wherein the method comprises the steps of:

generating exposure data for first layer wires and second layer wires using a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, two first layer wires of the same wiring being arranged at different locations and being connected to each other by a second layer wire, wherein the layout pattern is compacted by:

a) searching for an open area to which a first portion of one of the two first layer wires of the first wiring is moved in the second direction without interfering with first layer wires of other wirings;

b) establishing a layout prohibition area around a second layer wire of the otherwirings either if the second layer wire is located on a line extending from the second layer wire connecting the two first layer wires of the first wiring or if the second layer wire is located closer to the open area;

c) establishing a route to the open area for the second layer wire to be moved by bypassing the prohibition area, wherein the bypass route permits the layout of the second layer wire in the first direction and the second direction;

d) moving the first portion of the one of the two first layer wires of the first wiring to the open area;

e) extending the second layer wire connecting the two first layer wires of the first wiring along the bypass route; and f) connecting the extended second layer wire to the moved first portion;

forming a reticle based on the exposure data;

preparing a semiconductor substrate having an element formed thereon; and employing the reticle to layout wirings on the semiconductor substrate.

20. A computer readable recording medium having a program code thereon to compact a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, wherein the method comprises the steps of: (a) arranging two first layer wires of the same wiring at different locations and being connected to each other by a second layer wire and identifying first layer wires that obstruct a line extending in the first direction from one of the two first layer wires of the first wiring;

b) forming an enlarged area between the obstructed first layer wire from which said line extends and the identified first layer wire that obstructs said line;

c) shifting the other one of the two first layer wires of the first wiring to the enlarged area to be aligned along said line with the obstructed first layer wire;

d) establishing an original layout area of the other one of the two first layer wires of the first wiring as an open area; and e) deleting the second layer wire connecting the two aligned first layer wires and connecting the two first layer wires to form a single first layer wire.

21. The recording medium according to claim 20, wherein the method executed by the program code further comprises the steps of:

f) changing the two aligned first layer wires to one first layer wire; and g) deleting the open area when other first layer wires are not included in the open area.

22. A computer readable recording medium having a program code thereon to compact a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, two first layer wires of the same wiring being arranged at different locations and being connected to each other by a second layer wire, wherein the program code executes a method comprising the steps of:

a) searching for an open first area to which one of the two first layer wires of a same wiring of one of the plurality of wirings is moved in the second direction without interfering with first layer wires of other wirings of the plurality of wirings, wherein the second layer wire connecting the two first layer wires is not interfered with by second layer wires of other wirings;

b) moving the one of the two first layer wires to the open area;

c) extending the second layer wire connecting the two first layer wires in the second direction; and d) connecting the extended second layer wire with the moved first layer wire.

23. The recording medium according to claim 22, wherein the method executed by the program code further comprises the steps of:

e) deleting the area in which the moved first layer wire had been arranged before being moved.

24. A computer readable medium having a program code thereon to compact a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, two first layer wires of the same wiring being arranged at different locations and being connected to each other by a second layer wire, wherein the program code executes a method comprising the steps of:

a) searching for an open area to which a first portion of one of the two first layer wires of a same wiring of one of the plurality of wirings is moving in the second direction without interfering with first layer wires of other wirings of one of the plurality of wirings;

b) establishing a layout prohibition area around a second layer wire of the other wirings either if the second layer wire of the other wiring is located on a line extending from the second layer wire connecting the two first layer wires of said same wiring or if the second layer wire of the other wiring is located closer to the open area;

c) establishing a route to the open area for the second layer wire to be moved by bypassing the prohibition area, wherein the bypass route permits the layout of the second layer wire in the first direction and the second direction;

d) moving the first portion of the one of the two first layer wires to the open area;

e) extending the second layer wire connecting the two first layer wires along the bypass route; and f) connecting the extended second layer wire to the moved first portion.

25. The recording medium according to claim 24, wherein the method executed by the program code further comprises the step of:

g) deleting the first layer wire that includes the first portion.

26. A wiring layout apparatus for compacting a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, two first layer wires of the same wiring being arranged at different locations and being connected to each other by a second layer wire, wherein the apparatus comprises:

an input/output device for outputting wiring layout pattern data; and a computer for receiving the wiring layout pattern data from the input/output device to generate grid data used to represent the wiring layout pattern on a grid frame, wherein the computer uses the grid data for compacting the wiring layout pattern, and generates compacted wiring layout pattern data by:

a) identifying first layer wires that obstruct a line extending in the first direction from one of the two first layer wires of the first wiring;

b) forming an enlarged area between the obstructed first layer wire from which said line extends and the identified first layer wire that obstructs said line;

c) shifting the other one of the two first layer wires to the enlarged area to be aligned along said line with the obstructed first layer wire;

d) establishing an original layout area of the other one of the two first layer wires as an open area; and e) deleting the second layer wire connecting the two aligned first layer wires and connecting the two first layer wires to form a single first layer wire.

27. The apparatus according to claim 26, wherein the computer further generates compacted wiring layout pattern data by:

f) changing the two aligned first layer wires to one first layer wire; and g) deleting the open area when other first layer wires are not included in the open area.

28. A wiring layout apparatus for compacting a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, two first layer wires of the same wiring being arranged at different locations and being connected to each other by a second layer wire, wherein the apparatus comprises:

an input/output device for outputting wiring layout pattern data; and a computer for receiving the wiring layout pattern data from the input/output device to generate grid data used to represent the wiring layout pattern on a grid frame, the computer using the grid data for computing the compacting of the wiring layout, and generating compacted wiring layout pattern data by:

a) searching for an open first area to which one of the two first layer wires of a same wiring of one of the plurality of wirings is moved in the second direction without interfering with first layer wires of other wirings of the plurality of wirings, wherein the second layer wire connecting the two first layer wires is not interfered with by second layer wires of other wirings;

b) moving the one of the two first layer wires to the open area;

c) extending the second layer wire connecting the two first layer wires in the second direction; and d) connecting the extended second layer wire with the moved first layer wire.

29. The apparatus according to claim 28, wherein the computer further generating compacted wiring layout pattern data by:

e) deleting the area in which the moved first layer wire had been arranged before being moved.

30. A wiring layout apparatus for compacting a wiring layout pattern, the pattern including a plurality of wirings including at least a first wiring and a second wiring, each wiring having a plurality of first layer wires extending in a first direction and a plurality of second layer wires extending in a second direction generally perpendicular to the first direction, two first layer wires of the same wiring being arranged at different locations and being connected to each other by a second layer wire, wherein the apparatus comprises:

an input/output device for outputting wiring layout pattern data; and a computer for receiving the wiring layout pattern data from the input/output device to generate grid data used to represent the wiring layout pattern on a grid frame, the computer using the grid data for computing the compacting of the wiring layout, and generating compacted wiring layout pattern data by:

a) searching for an open area to which a first portion of one of the two first layer wires of a same wiring of the plurality of wirings is moved in the second direction without interfering with first layer wires of other wirings of the plurality of wirings;

b) establishing a layout prohibition area around a second layer wire of the other wirings either if the second layer wire of the other wiring is located on a line extending from the second layer wire connecting the two first layer wires of said same wiring or if the second layer wire of the other wiring is located closer to the open area;

c) establishing a route to the open area for the second layer wire to be moved by bypassing the prohibition area, wherein the bypass route permits the layout of the second layer wire in the first direction and the second direction;

d) moving the first portion of the one of the two first layer wires to the open area;

e) extending the second layer wire connecting the two first layer wires along the bypass route; and f) connecting the extended second layer wire to the moved first portion.

31. The apparatus according to claim 30, wherein the computer further generates compacted wiring layout pattern data by:

g) deleting the first layer wire that includes the first portion.

* * * * *